United States Patent
Hsu et al.

(10) Patent No.: US 6,263,002 B1
(45) Date of Patent: Jul. 17, 2001

(54) TUNABLE FIBER FABRY-PEROT SURFACE-EMITTING LASERS

(75) Inventors: Kevin Hsu, Roswell, GA (US); Calvin M. Miller, Naples, FL (US)

(73) Assignee: Micron Optics, Inc., Atlanta, GA (US)

(*) Notice: Subject to any disclaimer, the term of this patent is extended or adjusted under 35 U.S.C. 154(b) by 0 days.

(21) Appl. No.: 09/148,719

(22) Filed: Sep. 4, 1998

Related U.S. Application Data

(60) Provisional application No. 60/058,090, filed on Sep. 5, 1997.

(51) Int. Cl.[7] .................................................. H01S 3/30
(52) U.S. Cl. ................................. 372/6; 372/6; 372/20; 372/43; 372/24; 372/42
(58) Field of Search .................. 372/6, 20, 43, 372/24, 42

(56) References Cited

U.S. PATENT DOCUMENTS

| | | | |
|---|---|---|---|
| 4,848,499 | 7/1989 | Martinet et al. | 180/79.1 |
| 4,892,388 | 1/1990 | Taylor | 350/320 |
| 4,923,273 | 5/1990 | Taylor | 350/96.21 |
| 5,062,684 | 11/1991 | Clayton et al. | 385/27 |
| 5,073,004 | 12/1991 | Clayton et al. | 385/27 |
| 5,115,441 | 5/1992 | Kopf et al. | 372/45 |
| 5,181,213 | 1/1993 | Shinokura et al. | 372/30 |
| 5,212,745 | 5/1993 | Miller | 385/25 |
| 5,212,746 | 5/1993 | Miller et al. | 385/25 |
| 5,289,552 | 2/1994 | Miller et al. | 385/73 |
| 5,301,201 | 4/1994 | Dutta et al. | 372/43 |
| 5,305,336 | 4/1994 | Adar et al. | 372/18 |
| 5,365,539 | * 11/1994 | Mooradian | 372/75 |
| 5,375,181 | 12/1994 | Miller et al. | 385/27 |
| 5,397,739 | 3/1995 | Chalmers et al. | 437/129 |
| 5,422,470 | 6/1995 | Kubo | 235/462 |
| 5,425,039 | 6/1995 | Hsu et al. | 372/6 |
| 5,509,093 | 4/1996 | Miller et al. | 385/27 |
| 5,530,715 | 6/1996 | Shieh et al. | 372/96 |
| 5,563,973 | 10/1996 | Miller et al. | 385/81 |
| 5,666,373 | 9/1997 | Sharp et al. | 372/18 |
| 5,914,978 | * 6/1999 | Welch et al. | 372/50 |
| 5,946,438 | * 8/1999 | Minot et al. | 385/88 |

FOREIGN PATENT DOCUMENTS

| | | | |
|---|---|---|---|
| 0 712 182 A2 | 5/1996 | (EP) | H01S/3/085 |

OTHER PUBLICATIONS

Babic et al. (1996) "Fabrication and Characteristics of Double–Fused Vertical–Cavity Lasers" *Optical and Quantum Electronics* 28:475–485.

Babic et al. (1995) "Room–Temperature Continuous–Wave Operation of 1.54–$\mu$m Vertical–Cavity Lasers" *IEEE Photonics Technology Letters* 7:1225–1227.

Babic et al. (1994) "Double–Fused 1.52–$\mu$m Vertical–Cavity Lasers" *Technical Digest,* LEOS, Session PD1.4 pp. 1–2.

Dudley et al. (1994) "Low Threshold, Wafer Fused Long Wavelength Vertical Cavity Lasers" *Appl. Phys. Lett.* 64:1463–1465.

(List continued on next page.)

*Primary Examiner*—Frank G. Font
*Assistant Examiner*—Delma R. Flores Ruiz
(74) *Attorney, Agent, or Firm*—Greenlee, Winner & Sullivan, P.C.

(57) ABSTRACT

This invention provides compact, fixed-wavelength and tunable fiber-optic lasers comprising a gain medium, for example a semiconductor, half-cavity VCSEL, or an organic light emitting polymer, within a Fabry-Perot cavity wherein one of the mirrors forming the cavity is a mirror integral with a fiber, for example a mirror (metallic or dielectric, for example) deposited at a fiber end, a reflective tap within an optical fiber, a fiber Bragg Grating (FBG), or a fiber loop mirror. Semiconductor gain material can be bulk semiconductor material or comprise a semiconductor multiple quantum well region. The gain medium itself is not confined to a fiber. The FP cavity of these lasers typically contains a thin active medium ranging up to about 10 $\mu$m in length, but more preferably about 1 to about 21 $\mu$m in thickness

21 Claims, 13 Drawing Sheets

OTHER PUBLICATIONS

Fan et al. (1994) "10.1 nm Range Continuous Wavelength-Tunable Vertical–Cavity Surface–Emitting Lasers" *Electronics Letters* 30:1409–1410.

Fan et al. (1994) "8x6 Wavelength–Tunable Vertical Cavity Surface–Emitting Arrays" *IEEE Lasers and Electro–Optics Society 1994 7$^{th}$ Annual Meeting* Conference Proceedings. vol. 1, pp. 263–264.

Hecht (1995) "Wider Tunability and Lower Thresholds Improve VCSELs" *Laser Focus World* pp. 18–19.

Hsu et al. (1995) "Characterization of Microsecond Tuning Speed in Miniature Fiber Fabry–Perot Tunable Filters" *OFC '95 Technical Digest* pp. 18–19.

Hsu et al. (1998) "Continuous Wavelength Tuning of 850 nm Vertical–Cavity Surface–Emitting Laser in Fiber Fabry–Perot Cavity" *IEEE Photonics Tech. Letters* pp. 1–6.

Hsu et al. (1998) "Continuously Tunable Photopumped 1.3–$\mu$m Fiber Fabry–Perot Surface–Emitting Lasers" *IEEE Photonics Technology Letters* 10:1199–1201.

Hsu et al. (1995) "Instantaneous Multi–Wavelength Characterization of Microsecond Response Times in Fiber Fabry–Perot Filters" *IOOC–95* pp. 46–47.

Iga et al. (1988) "Surface Emitting Semiconductor Lasers" *IEEE Journal of Quantum Electronics* 24:1845–1855.

Jewell et al. (1991) "Vertical–Cavity Surface–Emitting Lasers: Design, Growth, Fabrication, Characterization" *IEEE Journal of Quantum Electronics* 27:1332–1346.

Jewell et al. (1989) "Low–Threshold Electrically Pumped Vertical–Cavity Surface–Emitting Microlasers" *Electronics Letters* 25:1123–1124.

Kozlov et al. (1997) "Low Threshold, High Peak Power Organic Semiconductor Lasers" *Conference on Lasers and Electro–Optics: CLEO–97.* pp. CPD18–2–CPD–18–3.

Kuznetsov et al. (1997) "High–Power (>0.5–W CW) Diode–Pumped Vertical–External–Cavity Surface–Emitting Semiconductor Lasers With Circular TEM$_{00}$ Beams" *IEEE Photonics Technology Letters* 9:1063–1065.

Larson and Harris (1995) "Wide and Continuous Wavelength Tuning in a Vertical–Cavity Surface–Emitting Laser Using a Micromachined Deformable–Membrane Mirror" *Appl. Phys. Lett.* 68:891–893.

Larson et al. (1995) "Vertical Coupled–Cavity Microinterferometer on GaAs With Deformable–Membrane Top Mirror" *IEEE Photonics Technology Letters* 7:382–384.

Leworsky (1996) "Deformable Mirror Tunes VCSEL Over 15 nm" *Laser Focus World* pp. 32–33.

Lin et al. (1994) "Low Threshold 1.59 $\mu$m Vertical–Cavity Surface–Emitting Lasers With Strain–Compensated Multiple Quantum Wells" *Technical Digest, LEOS Session SL4.2* pp. 252–253.

Margalit et al. (1997) "64°C. Continuous–Wave Operation of 1.5–$\mu$m Vertical–Cavity Laser" *IEEE Journal of Selected Topics in Quantum Electronics* 3:359–365.

Mortimore, D.B. (1988) "Fiber Loop Reflectors" *Journal of Lightwave Technology* 6:1217–1224.

Qian et al. (1997) :Low–Threshold Proton–Implanted 1.3–$\mu$m Vertical–Cavity Top–Surface–Emitting Lasers With Dielectric and Wafer–Bonded GaAs–AlAs Bragg Mirrors *IEEE Photonics Technology Letters* 9:866–868.

Ram et al. (1993) "Analysis of Wafer Fusing for 1.3 $\mu$m Vertical Cavity Surface Emitting Lasers" *Appl. Phys. Lett.* 62:2474–2476.

Rosiewicz et al. (1997) "Optical Pumping Improves VCSEL Performance" *Laser Focus World* 133–136.

Scott et al. (1994) "High Efficiency Submilliamp Vertical Cavity Lasers With Intracavity Contacts" *IEEE Photonics Technology Letters* 6:678–680.

Soda et al. (1979) "GaInAsP/InP Surface Emitting Injection Lasers" *Jpn. J. Appl. Phys.* 18:2329–2330.

Tessler et al. (1996) "Lasing From Conjugated–Polymer Microcavities" *Nature* 382:695–697.

Wipiejewski et al. (1993) "Tunable Extremely Low Threshold Vertical–Cavity Laser Diodes" *IEEE Photonics Technology Letters* 5:889–892.

Wipiejewski et al. (1993) "Efficient Alignment Tolerant Coupling of Vertical–Cavity Lasers To Single–Mode Fibers" *Technical Digest EOC* pp. 33–36.

Wu et al. (1995) "Speed and Polarization Characteristics of Widely Tunable Micromachined GaAs Fabry–Perot Filters" *CLEO '95—Conference on Lasers and Electro–Optics* vol. 15. pp. 342–343.

Yokouchi et al. (1992) "40 Å Continuous Tuning of a GaInAsP/InP Vertical–Cavity Surface–Emitting Laser Using an External Mirror" *IEEE Photonics Technology Letters* 4:701–703.

* cited by examiner

TUNABLE FIBER FABRY-PEROT SURFACE-EMITTING LASERS

This application takes priority under 35 U.S.C. 119(e) from U.S. patent application Ser. No. 60/058,090 filed Sep. 5, 1997 which is incorporated by reference herein to the extent that it is consistent herewith.

Vertical-cavity surface-emitting lasers (VCSELs) have recently received considerable attention because their unique structure offers several significant advantages over conventional edge-emitting lasers (see: K. Iga et al. (1988) "Surface emitting semiconductor lasers," IEEE J. Quantum Electron. 24:1845; H. Soda et al. (1979) "GaInAsP/InP surface emitting injection lasers," Jpn. J. Appl. Phys., 18:2329–2330; J. L. Jewell et al. (1989) "Low threshold electrically pumped vertical-cavity surface-emitting microlasers," Electron. Lett., 25:1123–1124; J. L. Jewell (1991) "Vertical-cavity surface-emitting lasers: Design, growth, fabrication, characterization," IEEE J. Quantum Electron. 27:1332–1346; A. Rosiewicz et al. (1997) "Optical pumping improves VCSEL performance" Laser Focus World (June) pp.133–136.) These advantages include (1) the possibility for monolithic integration with photonic circuits, (2) the ability to fabricate dense 2-dimensional laser arrays, (3) the convenience of full-scale on-wafer probe test before separation into chips, (4) robust single longitudinal mode operation due to the extremely short cavity between the bottom and top mirrors (reflective surfaces). The extreme short cavity of VCSELs, <2 µm in length including mirror thickness, gives a relatively large longitudinal mode spacing of >20,000 GHz. If the cavity length can be varied, these large mode spacings would allow continuous wavelength tuning without mode hopping. Single-frequency and tunable VCSEL are attractive for applications including among others: optical fiber communications, sensing, spectroscopy, data storage and retrieval, and display.

The output wavelength of VCSELs can presently be selected between about 400 to 1600 nm by appropriate choice of materials, thickness and doping of the quantum wells. Several wavelength regions are of particular interest for telecommunication applications (namely at λ=0.8 µm, 1.3 µm, and 1.55 µm.) VCSELs employing optical pumping as well as electrical pumping are known in the art.

Most VCSEL development has been in the shorter wavelength region of 08–0.98 µm due to the ease of fabrication.

A common problem associated with VCSELs is multiple transverse mode lasing due to a lack of lateral field confinement. Furthermore, there have been several areas of technical difficulty in fabricating long-wavelength (1.3 µm and 1.55 µm) VCSELs: the fabrication of mirrors exhibiting both high reflectivity and high thermal conductivity; the reduction of the intrinsically higher nonradiative losses in the active materials at these wavelengths; and the efficiency of current pumping techniques.

The cavity of VCSELs are of the order of a few wavelengths long and typically involve quarter-wave mirror and gain regions with no lateral guiding. Very high plane-wave reflection coefficients can be obtained with practical semiconductor quarter-wave mirrors, but for beams of finite width, the reflection coefficient of a mirror with no lateral guiding, and hence the finesse of cavities that use such structures, will be limited by diffraction loss. Standard semiconductor Bragg mirrors made of quaternary materials require thick multi-layers to reach high-reflectivity (R>98%) for λ=about 1.55 µm, which in turn introduce high diffraction losses. Low-loss dielectric mirrors using $Si/SiO_2$ and $TiO_2/SiO_2$ have been tested as a solution to this problem, but they provide poor thermal conductivity.

Long wavelength lasing at 1.59 µm via optical pumping at 0.84 µm wavelength has been demonstrated by C. H. Lin et al. (1994) "Low threshold 1.59 µm vertical-cavity surface-emitting lasers with strain compensated multiple quantum wells," Technical Digest, LEOS session SL4.2.

A semiconductor wafer-fusion technique used to fuse an AlAs/GaAs mirror to an InGaAsP active region has demonstrated 1.52 µm lasing under pulsed electrical pumping (D. I. Babic et al. (1994) "Double-fused 1.52 µm vertical-cavity lasers," Technical Digest, LEOS, session PD1.4.) Development of electrical pumping via intracavity contacts has demonstrated 1.01 µm lasing with several mW of output power (J. W. Scott (1994) "High efficiency submilliamp vertical cavity lasers with intracavity contacts," IEEE Photonics Tech. Lett. 6:678.) Intracavity pumping bypasses the inherently high electrical resistance through Bragg mirrors, to provide an approach for long-wavelength VCSEL development.

CW (continuous-wave) operation of VCSEL lasers at ~1.5 µm has been reported at room temperature by D. I. Babic et al. (1995) "Room temperature continuous-wave operation of 1.54 µm vertical-cavity lasers." IEEE Photonics Technol. Lett., 7:1225 and at 64° C. by N. M. Margalite et al. (1997) "64° C. Continuous wave operation of 1.5 µm vertical-cavity laser," IEEE J. Select. Topics Quantum Electron. 1(2): 359. Recent VCSEL research incorporating dielectric and semiconductor wafer-bonded Bragg mirrors show promise for the development of room temperature CW operation of a 1.3 µm VCSEL (Y. Qian et al. (1997) "Low-threshold proton-implanted 1.3 µm vertical-cavity top-surface-emitting lasers with dielectric and wafer-bonded GaAs—AlAs Bragg Mirrors," IEEE Photonics Technol. Lett, 2:866–868.)

Tuning of VCSELs has been accomplished by tuning the cavity length in several ways. N. Yokouchi et al. (1992) "40 Å Continuous tuning of a GaInAsP/InP vertical cavity surface emitting laser using an external mirror," IEEE Photonics Technol. Lett. 4:701–703 reports a VSCEL with an external $Si/SiO_2$ dielectric mirror directly butt-coupled to one side of the SEL controllable to 10 Å. A tuning range of 4 nm (40 Å) was achieved under CW operation across the 1.44 µm wavelength region at liquid nitrogen temperatures by physically moving the external mirror. The tuning range was reportedly limited because of misalignment between the mirror and the chip.

T. Wipiejewski et al. (1993) "Tunable extremely low-threshold vertical-cavity laser diodes," IEEE Photonics Technol. Lett., 5:889–892 reports 8-µm active diameter VCSEL device with threshold current of 650 µA. A tuning range of 2.2 nm is reported for a similar low threshold 12-µm active diameter VCSEL device. Wavelength tuning in this VCSEL were achieved using thermal effects to vary the optical cavity length. The tuning range in such devices is limited by the maximum possible change of the refractive index in the laser. A maximum 10-nm tuning range has been obtained using such thermal effects (L. Fan et al. (1994) "10.1 nm range continuous wavelength-tunable vertical cavity surface-emitting laser," Electron. Lett. 30:1409–1410 and L Fan et al. (1994) "8×6 Wavelength tunable vertical-cavity surface-emitting arrays," Proc. LEOS, Boston Mass. paper SL5.3.)

M. Y. Li et al. (1998) "Top-emitting micromechanical VCSEL with a 31.6 nm tuning range," IEEE Photon. Technol. Lett. 10:18–20 reports continuous tuning over 31.6 nm in a VCSEL structured with a micromachined gap formed with a cantilevered arm between the top and bottom mirrors of the VCSEL. Tuning was achieved by varying the gap by application of a 0–5.7 V to the arm to create electrostatic attraction toward the substrate. E. C. Vail et al. (1995) OSA Topical Digest for CLEO'95/QELS (Baltimore, Md.), QPD12-2 (see: J. Hecht (1995) "Wider tunability and lower thresholds improve VCSELs" Laser Focus World) had earlier reported a 15-nm tuning range in a similarly structured 960 nm VSCEL.

M. C. Larson et al.(1996) "Wide and continuous wavelength tuning in a VCSEL using a micromachined deformable-membrane mirror," Appl. Phys. Lett. 68:891–893 and M. C. Larson et al. (1995) IEEE Photonics Technol. Lett. 7:382–384 (see also: K. Lewotsky (1996) "Deformable mirror tunes VCSEL over 15 nm," Laser Focus World April p.32) relate to VCSEL structures within microinterferometers constructed with a suspended deformable-membrane top mirror. Cavities were tuned by application of a 0–14 V bias to give a 32-nm tuning range at the 920 nm center wavelength, but the actual laser tuning was obtaining over 15 nm in pulsed-mode operation. These devices are useful in 2-D arrays, in particular for displays; however, efficient and compact fiber coupling has not been achieved for compatibility with fiber optic technology platforms.

The present invention relates to the combination of VSCEL technology with optical fiber alignment techniques and fiber alignment fixtures which have been used to achieve low-loss and high-finesse all-fiber fixed and tunable Fabry-Perot interferometers.

Fiber Fabry-Perot tunable filters (FFP-TFs, also called FFPIs, fiber Fabry-Perot Interferometers) are all-fiber devices that consist of two mirrors deposited directly onto fiber ends forming the FP cavity, a single-mode fiber waveguide (5 $\mu$m to 10 mm in length) bonded to one mirror within the cavity, a 1–3 $\mu$m air gap also within the cavity for tuning, and a piezoelectric actuator to control the air gap length to sub-Angstrom tolerances for tuning, dithering and wavelength locking. FFP-TFs also exhibit excellent thermal (0.01 FSR/° C. from −20° to 80° C.) and mechanical stabilities.

The single-mode fiber waveguide segment in the FFP-TF not only provides intra-cavity waveguiding, but its length together with the air-gap thickness also define the free spectral range (FSR) of a filter. The fibers of the cavity are typically aligned in a piezoelectric (PZT) fixture which maintains alignment and tuning is achieved with PZT actuators that are capable of positioning accuracy on the order of atomic dimensions. These devices are robust and field-worthy compared to traditional lensed Fabry-Perot interferometers. U.S. Pat. Nos. 5,212,746; 5,289,552; 5,212,745; 5,375,181; 5,425,039; 5,422,970; 5,509,093; 5,563,973; 5,062,684; and 5,073,004 disclose a number of alignment fixtures for FP interferometers. U.S. provisional patent application Ser. No. 60/082,139, filed Apr. 17, 1998 which is incorporated by reference herein to the extent that it is not inconsistent herewith, also discloses ferrule alignment fixtures that can be employed in the device configurations of this invention. Miniature FFP tunable filters are discussed in K.Hsu, et al. (1995) "Characterization of microsecond tuning speed in miniature fiber Fabry-Perot tunable filters," Summaries of Papers Presented at the Conference on Optical Fiber Communication, 1995 Technical Digest Series, Vol. 8 p.18–19, Opt. Soc. Am., Washington, DC. and K. Hsu et al. (1995) "Instantaneous multi-wavelength characterization of microsecond response times in fiber Fabry-Perot filters," IOOC-95 (WB1-5) p.46–47.

The stable, high performance characteristics of the FFP-TF are due, at least in part, to the presence of the single-mode intra-cavity fiber waveguide which prevents beam "walk-off", eliminates extraneous cavity modes, and facilitates accurate mirror alignment required for high-finesse and low-loss operation. Total fiber length inside the cavity ranges from a few micrometers to a few millimeters for telecommunication components.

An important characteristic of FFP-TFs is the high accuracy with which measured response corresponds to theoretical response. This allows WDM systems and WDMA networks to be easily designed using the Airy function to calculate system performance parameters. Another important feature of PZT controlled tunable filters is the ease with which these devices can be locked onto any laser source whose passband is narrow and stable within the resolution of the FFP device. This is due to the precise positioning capability of PZT actuators which allow mirrors to be dithered (moved by a sinusoidal electrical signal) only a fraction of an Angstrom distance peak-to-peak and operated in a phase-locked loop. For telecommunication, remote-sensing, or laser wavelength tuning applications this allows the filter to "track" small wavelength variations in the laser and correct for thermal or mechanical drifts in the filter that would normally be disruptive.

FFP-TFs are being used extensively with erbium-doped-fiber-amplifiers (EDFAs) for dense wavelength division multiplexors and noise filters.

Highly perpendicular and smooth optical surfaces as well as low-loss mirror coatings are preferred to achieve low-pass and high-finesse FFP-TFs. FFP-TFs having fiber-to-fiber insertion loss of <0.5 dB for a finesse of 200, and loss of <3 dB for a finesse of 700, are routinely made and are commercially available as standard products using telecommunications grade single-mode fiber. FFP-TFs having the very high finesse of 4000 and a loss of ~5 dB or less have been made employing techniques and alignment fixtures described in the above-referenced U.S. patents.

SUMMARY OF THE INVENTION

This invention provides compact, fixed-wavelength and tunable fiber-optic lasers comprising a gain medium, for example a semiconductor, half-cavity VCSEL, or an organic light emitting polymer, within a Fabry-Perot cavity wherein one of the mirrors forming the cavity is a mirror integral with a fiber, for example a mirror (metallic or dielectric, for example) deposited at a fiber end, a reflective tap within an optical fiber, a fiber Bragg Grating (FBG), or a fiber loop mirror. Semiconductor gain material can be bulk semiconductor material or comprise a semiconductor multiple quantum well region. The gain medium itself is not confined to a fiber. The FP cavity of these lasers typically contains a thin active medium ranging up to about 10 $\mu$m in length, but more preferably about 1 to about 2 $\mu$m in thickness. Wavelength tuning in the lasers of this invention is preferably achieved by changing a small intracavity air-gap (on the order of 1–10 $\mu$m in length, preferably 1–2 $\mu$m in length), by stretching (or contracting) a fiber or by changing the cavity-FBG length. The fiber can be stretched or contracted mechanically, electromechanically or thermally by controlled temperature variation. In particular, piezoelectric transducers or stepping motors ca be employed for tuning.

The lasers of this invention are designated hybrid fiber lasers which are defined herein to have an active cavity that is a Fabry-Perot resonator containing a gain element which can, for example, be a semiconductor layer or an organic polymer layer, wherein one mirror of the Fabry-Perot resonator is a fiber-integrated mirror and wherein the gain element is not itself confined within optical fiber. The gain element is preferably a thin layer within the Fabry-Perot filter. The gain element may itself be unguided or it may possess an integral guiding feature. Robust lasing, particularly single mode lasing, operation in these hybrid fiber lasers is best obtained using short and compact cavity structures. Single longitudinal-mode laser operation can be obtained when the Fabry-Perot (FP) mode spacing of a short resonator cavity is large compared to the gain bandwidth, such that only one mode acquires sufficient gain to reach lasing threshold. Continuous wavelength-tuning is then achieved by tuning of the FP cavity length, for example by tuning the air gap using a piezoelectric transducer. Multiple mode lasing can be achieved in hybrid lasers of this invention in which the FP cavity is long, i.e., greater than or equal to about 1 to about 10 mm in length, or very long, i.e. greater than about 10 mm.

A FP resonator, particularly those constructed at least in part using an optical fiber ferrule assembly with optical fiber waveguides, allows very high cold-cavity finesse to be achieved in a convenient, tunable package, thus facilitating the use of a gain element that is not confined to a fiber or other external waveguide in which the single-pass gain is <0.1 dB. To achieve broad tuning range in substantially single-mode operation, two basic conditions should be met: (1) short cavity length which gives wide free spectral range (FSR), and (2) high gain over wide bandwidth. A proper balance between wide FSR and wide gain-bandwidth avoids lasing in two longitudinal modes, yet allows a wide tuning range. Hybrid fiber lasers of this invention can achieve a tuning range equal to or greater than 50% of the FSR of the FFP. Preferred hybrid lasers of this invention can achieve a tuning range equal to or greater than 75% of the FFP FSR. More preferred hybrid lasers of this invention can achieve a tuning range substantially over the entire FFP FSR.

The active gain media of most interest for the lasers of this invention include semiconductor materials such as AlGaAsP, InP, ZnSe, or InGaAsp, GaN, or combinations thereof and organic polymer materials, which can generate lasing over a wavelength span from near-UV to near-IR.

In particular embodiments, this invention provides compact, fixed-wavelength and tunable semiconductor fiber-optic hybrid lasers comprising a semiconductor quantum-well vertical-cavity surface-emitting laser (VCSEL) within a fiber Fabry-Perot (FFP) cavity. The combination of a "half-cavity" VCSEL and an external fiber mirror forms a fiber Fabry-Perot surface-emitting laser (FFP-SEL, 10) as illustrated in FIGS. 1A–1E.

A "half-cavity" VCSEL (5) as shown in FIG. 1A consists of a semiconductor Bragg reflector (i.e., bottom mirror, 1) and a multiple quantum well (MQW, 2) gain region. The output mirror (i.e., the top high reflectivity mirror that enables lasing) is formed by a fiber-optic reflector (3) integrated with the optical fiber which can be, for example, a direct fiber dielectric mirror, as illustrated in FIG. 1A, a fiber waveguide dielectric mirror (FIG. 1B), a fiber Bragg grating (FBG, FIG. 1C), or a fiber loop mirror (FIG. 1D). Wavelength tuning can be achieved in a variety of ways including, but not limited to, air-gap tuning and/or fiber stretching inside the FFP-SEL cavity. When a fiber Bragg grating is used as the fiber-integrated mirror wavelength tuning (FIG. 1C) is achieved by length-tuning of the FBG or of an air-gap/FBG combination. The optical properties and size of the fiber employed in the hybrid fiber laser configurations can be selected for a given application, or to achieve improved laser properties. For example, the laser configuration of FIG. 1E, illustrates the use of a fiber with an expanded mode-field diameter (expansion from about 9 $\mu$m to about 35 $\mu$m can be employed.)

The "half-cavity" VCSEL can have no surface coating on the gain material with residual reflection of 30% or less. Alternatively, the half-cavity can be provided with an AR (anti-reflective) coating to reduce reflectivity. Another alternative for the "half-cavity" is the provision of a low-reflectivity mirror at the top surface of the gain material, for example, a low-reflectivity semiconductor Bragg mirror, i.e., a few Bragg layers to give low-reflectivity. The optional, low-reflectivity Bragg mirror at the top surface of the gain material does not itself enable lasing. Lasing requires the presence of the top mirror which is the fiber integrated mirror in the FFP-SEL. The inclusion of an additional mirror having low-reflectivity at the top surface of the gain material is believed to reduce cavity loss. Certain FFP-SEL with "half-cavities" having a low-reflectivity mirror at the gain material surface within the FP cavity are discretely tunable rather than continuously tunable.

The FFP-SEL of this invention can be tunable or fixed wavelength lasers. The FFP-SEL of this invention can provide robust single transverse-mode or single longitudinal-mode lasing in a small compact structure with an FFP cavity, which does not require bulk or micro-optical components. The FFP cavity of these lasers may be an all fiber FP cavity having optical fiber extending the length of the FP cavity (excluding the gain region which is not fiber-confined) Or more typically contain an FP cavity air gap to facilitate tuning.

Tunable FFP-SEL enables continuous wavelength tuning by directly changing FP cavity length with a wide wavelength tuning range >10,000–20,000 GHz. In particular, the use of a fiber-waveguide mirror (FIG. 1B) as the top mirror of the VCSEL provides for mode-field shaping, confinement and improved laser performance. FFP-SEL of this invention facilitate short-pulse generation by mode-locking and provide means for polarization control. The fiber cavity of the FP can provide polarization-dependent loss (PDL) allowing polarization selection. The structure of the fiber itself can be controlled to enhance polarization selection. For example, a side-polished (D-shaped fiber) provided with a metal coating on the polished side can induce evanescent field coupling loss to give polarization selection.

By incorporating a VCSEL into a FFP cavity, the low-loss high-reflectivity dielectric mirror in or on the output fiber replaces the VCSEL's top mirror. The bottom mirror employed is a standard mirror employed for VCSELs. Preferably the bottom mirror is designed to provide desired reflectivity at the lasing wavelength ( (typically >99%) and thermal conductivity requirements. The mirror is preferably selected to substantially avoid temperature change in the device that would damage the gain material or create lasing instability. These requirements can be met, for example, with hybrid mirrors, wafer-fused mirrors, or monolithic mirror designs.

The hybrid lasers of this invention can be configured as optically pumped systems or as electrically pumped systems. FFP structures are convenient for optical pumping of VCSELs and can be readily adapted using known techniques with a current supply for electrical pumping of VCSELs.

FFP-SELs of this invention can employ the fast tuning and dithering capabilities of FFP fixtures for wavelength locking to external references and to compensate for thermal changes. FFP-SELs of this invention can be combined with a variety of optical components for a variety of laser applications. For example, various gain amplifiers can be coupled to the hybrid lasers of this invention.

BRIEF DESCRIPTION OF THE DRAWINGS

FIG. 7A is a cross-section of the ferrule and VCSEL aligned within the PZT fixture. FIG. 7B is a perspective view of the device with tuning fixture. FIG. 7C is a view of the mounting element with half-cavity VCSEL.

DETAILED DESCRIPTION OF SPECIFIC EMBODIMENTS

Figure 1A:
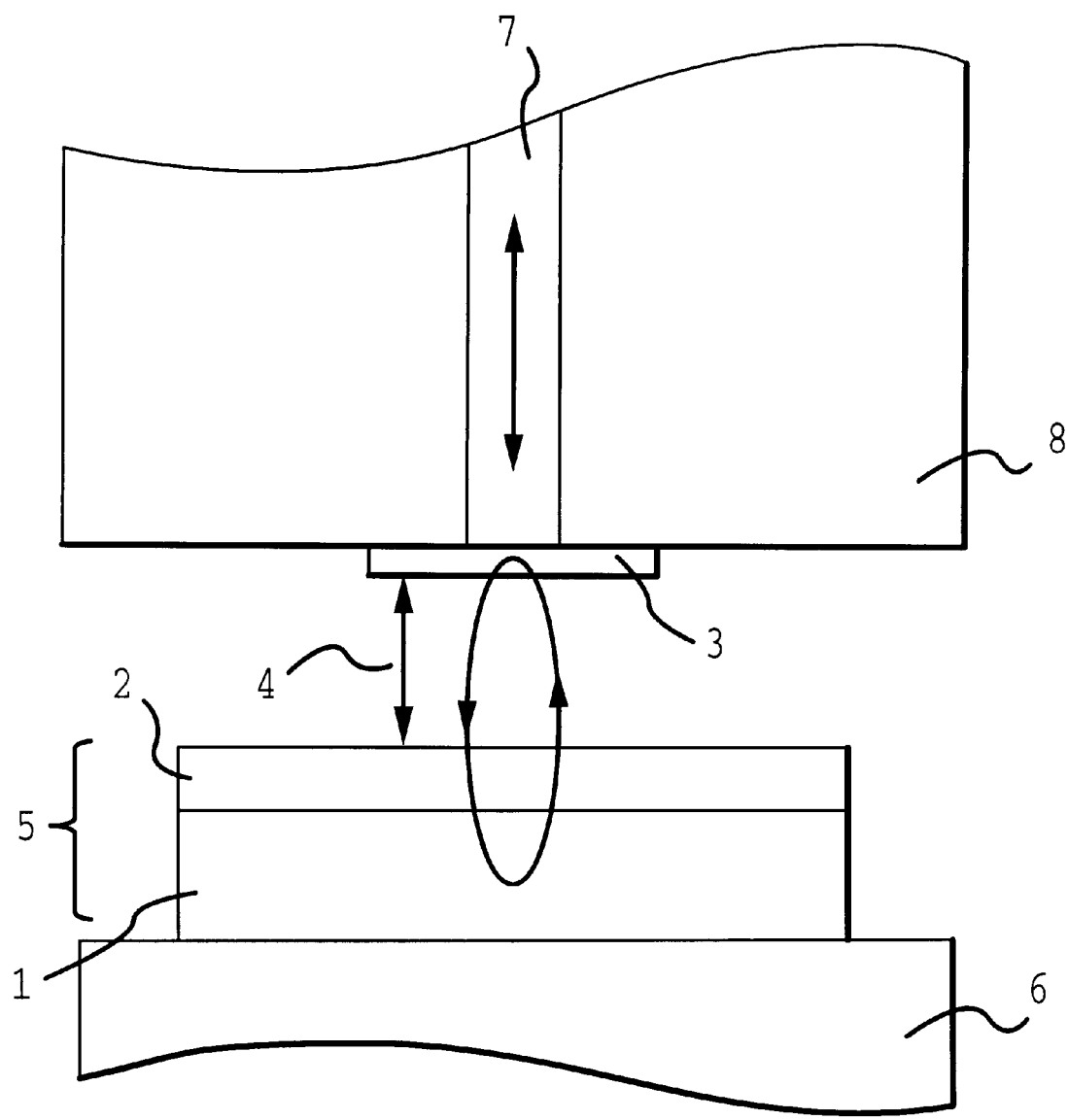
FIGS. 1A–1E illustrate hybrid fiber laser configurations of this invention.

The FFP-SELs in FIGS. 1A–1E (not necessarily drawn to scale and in which like reference numbers indicate like features) each consist of a half-cavity (or topless) VCSEL (5) having a highly reflective bottom mirror (1) and a MQW gain region (2), completed by an external top fiber integrated mirror or reflective device. In FIG. 1A (a cross-sectional expanded view) the top mirror is a fiber integrated mirror (3) deposited on the facet of an optical fiber (7). The gain material and the bottom mirror are bonded to a ferrule (6) as a submount. Ferrules 6 and 8 are cylindrical elements used to facilitate alignment in the device to maximize light transmission and/or single mode lasing. An optical fiber is axially mounted within ferrule 8 which is typically made of glass. The VCSEL half cavity is mounted on the ferrule 6. The optical fiber (with coating removed) is fixed in the glass ferrule (8) with a fiber end at one internal end face of the ferrule. Fiber exits the ferrule from the other external end face for optical connection as appropriate. Both ferrules are mounted in an alignment fixture (see FIG. 6) for precise relative positioning and alignment. Alignment of the ferrule submount (6) with half-cavity VCSEL and optical fiber ferrule is preferably adjusted to maximize single mode lasing. In the device of FIG. 1A the intra-cavity air-gap (4) and thus the overall cavity length are varied by piezoelectric drives in the fixture to provide wavelength tuning. In a typically alignment fixture, the relative positions of the two ferrules are changed to tune (increase or decrease) the air-gap without substantially loss of alignment. As indicated above, the "half-cavity" VCSEL can be provided with an AR coating or with a low-reflectivity mirror at the surface above the gain material.

Figure 1B:
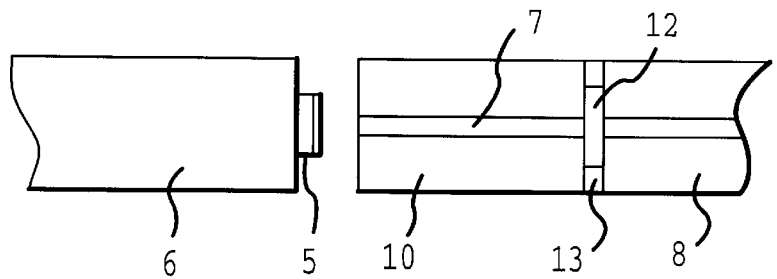

FIG. 1B is cross-sectional view of an FFP-SEL comprising a waveguide portion (10) containing optical fiber (7) with the top mirror function served by an imbedded mirror (12) between the waveguide portion and the fiber ferrule (8). The mirror is integral with the fiber typically deposited at the waveguide or ferrule end face at a fiber end. $Si/SiO_2$ or $TiO_2/SiO_2$ layers deposited at fiber ends are typically used as mirrors. The waveguide and ferrule are aligned for maximum light transmission and bonded with a UV-cured epoxy layer (13) providing what has been previously designated a wafered ferrule. The fibers (7) in the waveguide and ferrule are substantially optically continuous when aligned.

Rotary ferrule alignment techniques that have previously been described can be used for alignment of ferrules and waveguide portions of ferrules. These techniques have been applied to manufacture of ferrule assemblies for lensless FFP fixed and tunable filters. Automated fiber ferrule alignment systems are now commercially available and can be used in alignment of the ferrules of the laser devices of this invention. Systems available from Melles-Griot employing v-groove ferrule holders have been used to automatically align fibers of ferrules in the x and y directions to maximize light transmission through the fibers in FFP interferometers. These same systems can be used to maximize alignment for lasing in the devices of this invention.

Figure 1C:
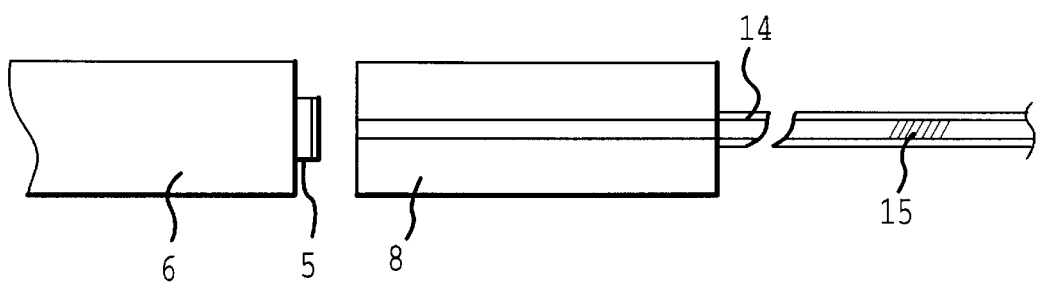

FIG. 1C is a cross-sectional view of an FFP-SEL comprising a Fiber Bragg Grating (FBG) (15) to function as the top mirror. The FBG is within the optical fiber and may be positioned within the fiber portion inside of the ferrule or in the fiber portion extending outside of the ferrule. The portion of the fiber outside of the ferrule may be provided with a coating (14). In this case the FFP can be tuned by stretching the fiber in the cavity. FBGs have been used extensively in sensing applications and are described, for example, in U.S. Pat. Nos. 4,996,419; 5,380,995; and 5,397,891.

Figure 1D:
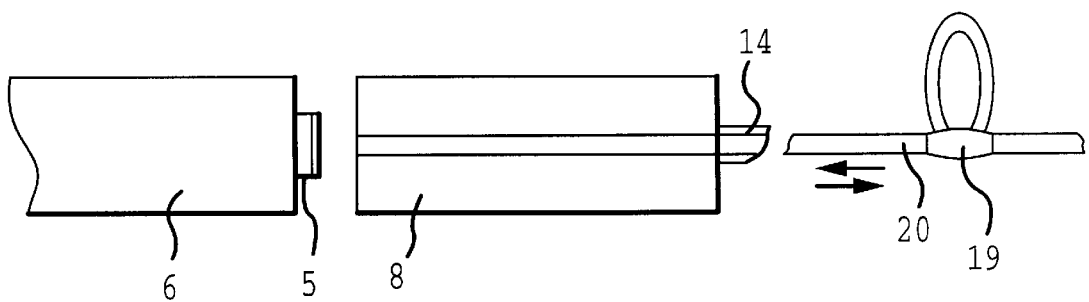

FIG. 1D is a cross-sectional view of an FFP-SEL comprising a fiber loop reflector (20) which functions as a fiber-integrated top mirror. Fiber loop reflectors have been described, for example, by D. Mortimore (1988) "Fiber loop reflectors," J. Lightwave Technol. 6(7): 1217. Portions of the fiber external to the ferrule may have a coating (14). Hybrid lasers incorporating a fiber loop as the top mirror can be tuned by changing the cavity length, i.e. by changing the air-gap or stretching the intracavity fiber or both.

Figure 1E:
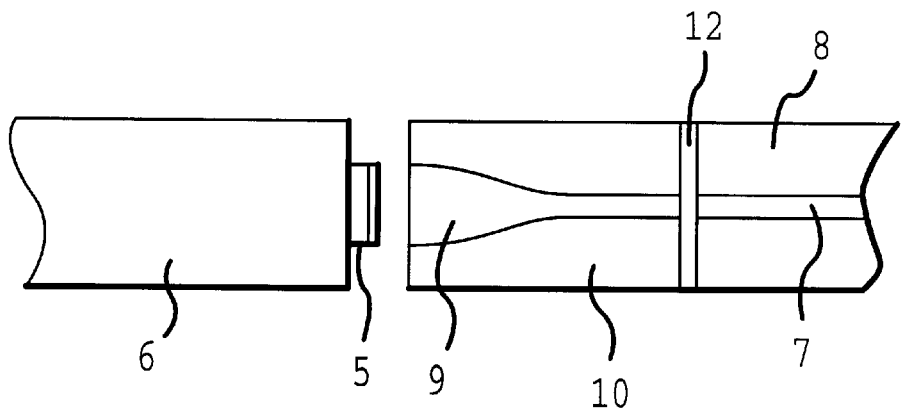

FIG. 1E is a cross-sectional view of an FFP-SEL comprising a single-mode fiber mirror (a waveguide mirror) with a thermally-diffused expanded core fiber (TEC) (9). The TEC fiber has an expanded mode-field diameter (e.g., expanded from about 9 μm to about 35 μm at the output end. The TEC can couple more power from a larger aperture half-cavity VCSEL and maintain single transverse mode operation. The device of FIG. 1E is illustrated with a deposited embedded mirror (12), but also may be configured with a direct (endface) mirror, an FBG, a fiber loop reflector or a reflective fiber tap. TEC fiber is commercially available from a variety of sources.

Although not specifically illustrated in a figure herein another alternative fiber-integrated mirror is a reflective tap introduced into an optical fiber. Fiber fusion techniques can be used to introduce reflective taps (i.e., mirrors into optical fibers). Electrical arc and/or thermal fusion methods can be used to form reflective taps. See, for example, U.S. Pat. Nos. 4,848,999; 4,892,388; and 4,923,273 for fusion techniques.

Ferrule (6) in FIGS. 1A–1E can be a glass ferrule, a glass metal-coated ferrule, or a metal ferrule. In one optically pumped system configuration, pump laser light can be introduced into the half-cavity via ferrule (6). In that case, ferrule 6 is provided with an axial optical fiber which can be optically coupled into the pump laser. Metal ferrules are preferred to facilitate heat dissipation to avoid thermal damage to the gain material. A metal ferrule or metal-coated glass ferrule can be provided with an axial bore for receiving and bonding to an optical fiber to provide pump laser light.

All of the laser devices illustrated in FIGS. 1A–1E can be adapted for use with organic polymer gain materials in place of the gain materials in the half-cavity VCSELs. Thin-film layers of polymeric organic semiconductor materials can be introduced into FFP cavities of this invention, for example thin films can be spun-on or vacuum-deposited on bottom mirrors as gain materials (2) in FIGS. 1A–1D. Lasing from exemplary organic polymeric materials is reported in N. Tessler et al. "Lasing from conjugated-polymer microcavities," (1996) Nature 382:695 [poly(p-phenylenevinylene) (PPV)] and V. G. Kozlov et al. (1997) "Low threshold, high peak power organic semiconductor lasers," Conference on Lasers and Electro-Optics, CLEO-97 (paper CPD18-2) [tris(8-hydroxyquinolinie)aluminum (Alq$_3$)].

Figure 2:
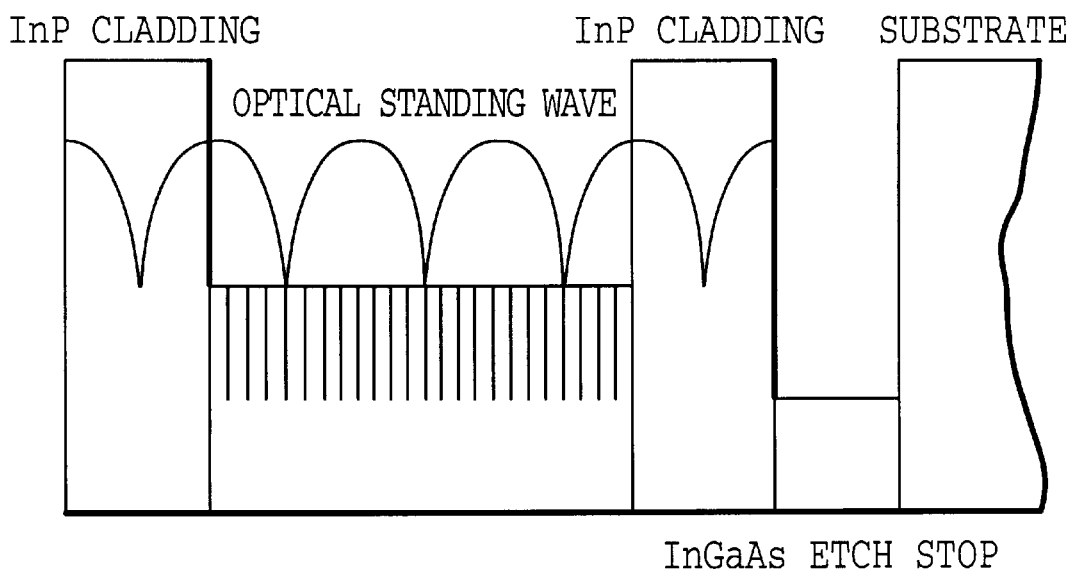
FIG. 2 is a schematic illustration of a quantum well semiconductor gain region.

A schematic of an exemplary $\lambda$=1.5 $\mu$m gain medium is depicted in FIG. 2, which consists of 23 InGaAsP quantum wells with a thickness of 50 Å. The quantum wells are equi-distantly distributed in quaternary InGaAsP giving a total thickness of 684 nm which corresponds to 1.5 $\mu$m optical wavelengths. Alternatively, the active material can be grouped in the antinodes of the standing wave pattern in the laser to decrease the threshold power by almost a factor of two. However, such a periodic gain structure would put higher demands on the thickness control during epitaxial growth which is used to produce the semiconductor gain medium. The active material in FIG. 2 is embedded between InP cladding layers each 244 nm thick. MOCVD growth techniques on InP substrates can be used to fabricate the epitaxial material. The InP substrate is selectively etched away from a 200 nm thick InGaAs etch stop layer to fit the active layer in to a short optical cavity. Eventually, the InGaAs etch stop layer is also removed by continued etching.

The InGaAsP material is the absorber for the 980 nm pump light with an estimated total absorption of 50% for a single pass. For optical pumping configurations the absorption is preferably high to insure the efficient use of pump light for the generation of carriers. A use of a thicker InGaAsP region would increase the absorption, but the carrier distribution could also become very non-uniform. The use of a metal mirror on the bottom can enhance the absorption by reflecting the transmitted pump power back into the active region, increasing efficiency to about 75%.

AR coatings for the pump and lasing wavelengths are optionally deposited on the InP surface of the front side to avoid insertion loss by Fresnel reflections.

The bottom mirror of the laser is preferably selected to provide high reflectivity and sufficiently high thermal conductivity to remove the dissipated heat from the active region. Distributed Bragg reflectors (DBRs) of dielectric materials like $SiO_2$—$TiO_2$ or $SiO_2$—$Si_3N_4$ can be highly reflective, but do not have high thermal conductivity. Hybrid mirrors consisting of a metal reflector and a short DBR stack provide increased heat sinking, but the thermal conductivity of such materials may be too low in a given configuration. In contrast, a hybrid reflector with Ag and MgO gives excellent heat sinking properties, due to the relatively high thermal conductivity of MgO, which is even higher than that of GaAs. The calculated reflectivity of a single MgO layer with Ag on top is 98.2% from InGaAsP with a refractive index of 3.4. Reflectivity can be further increased by inserting a few pairs of InGaAsP-InP or amorphous Si—MgO quarter-wavelength layers between the active region and the MgO layer. High reflectivity and good heat sinking can also be obtained using an AlAs—GaAs DBR. This DBR on a GaAs substrate can be bonded to the InP material by wafer fusion (R. J. Ram et al. (1993) "Analysis of wafer fusing for 1.3 $\mu$m vertical-cavity lasers," Appl. Phys. Lett. 62:2474.) The interface between the materials is optically smooth with good thermal and electrical properties. Wafer fusion has been successfully demonstrated in the fabrication of long-wavelength SELs (J. J. Dudley et al. (1994) "Low threshold wafer fused long wavelength vertical cavity lasers," Appl. Phys. Lett. 64:1463 as well as Babic et al. and Margalit et al. supra).

In a typical VCSEL, index-guiding by post-etching, oxide confinement, as well as gain guiding in the active layer and thermally induced index guiding can help shape the laser mode. However, multiple frequency lasing due to multiple transverse lasing modes remains a major concern in the development of VCSELs. FFP technology employing ferrule assemblies capable of providing short fiber sections of a few $\mu$m within highly resonant cavities, to provide waveguiding or lens-like functions and to minimize intracavity diffraction loss will also provide a wave-shaping mechanism to facilitate single transverse mode lasing.

Figure 6:
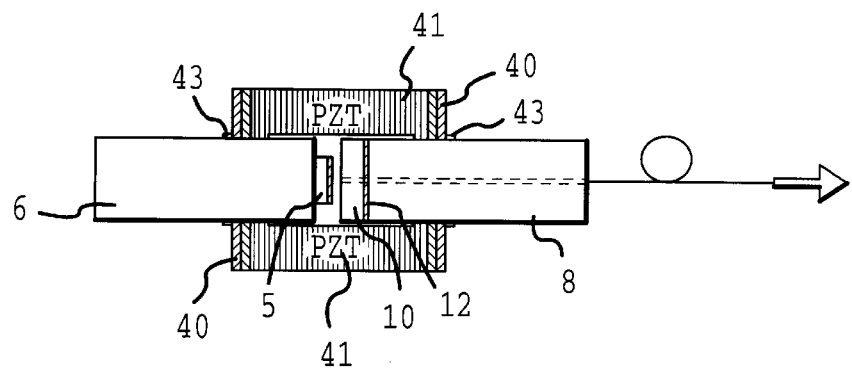
FIG. 6 is a schematic cross-sectional illustration of hybrid fiber laser of this invention with ferrules mounted in an alignment fixture having piezoelectric transducers to facilitate tuning.

All of the criteria discussed above for optically-pumped VCSELs also hold for electrically-pumped VCSELs. In addition, means for current supply to the VCSEL must be provided for electrical pumping. A relatively long absorbing region for the pump light is not needed and the total thickness of the active layer is preferably less than about 100 nm to ensure homogeneous carrier distribution while injecting carriers. As a result fewer quantum wells, perhaps a minimum of seven, are needed. The quantum wells can be placed in the antinode of the standing wave to decrease the lasing threshold (current threshold). The InP cladding layers are p-type and n-type doped for current supply. The wafer-fused GaAs-AlAs bottom mirror can be n-type doped to provide a path for current supply. The p-type contact is deposited on an additional InGaAsP layer on top of the InP surface, which has an annular shape for light transmission. In the approach where some dielectric materials are used in the bottom mirror, the n-contact can also be made via a ring-contact. Proton implantation or selective etching techniques can be employed to funnel the current in the active area where the optical mode field amplitude is maximal. This provides the highest power conversion efficiency. Index guiding for the laser mode is also achieved simultaneously. The index-guided lasing channel should be well aligned to the center of a metal ferrule during bonding to enable proper FFP cavity alignment in a piezoelectric alignment/tuning fixture, and to provide high coupling efficiency to the output fiber. This constraint is relaxed however, if a sub-miniature, high speed FFP fixture, as illustrated in FIG. 6 (discussed below) is employed.

There are a number of methods available in the art for providing current to the half-cavity VSCELs of the lasers of this invention. Two possible methods for providing current supply to the laser chip are discussed in more detail. One option is to wire bond a contact pad on the laser chip to a pedestal on the metal ferrule from which the wire is soldered to make connection. Alternatively, a beam lead technique can be employed in which a fairly thick Au wire is electroplated on the wafer before it is diced up into small chips. This method requires fewer parts and processing step in the packaging and is more cost effective.

Passive thermal compensation of the FFP fixture can be applied to stabilize the external-cavity length to an optimum extent. Methods of passive and active thermal compensation of FFP fixtures are known in the art. A thermal-electric cooler can be added to provide active temperature control of the entire package to stabilize both the laser gain spectrum and the external-cavity length. Both the output wavelength and power controls will be more reliable with a controlled ambient temperature.

The integration of VCSELs with FFP technology provides lasers that have single frequency operation, wide tuning ranges, with efficient optical pumping or direct electrical pumping and modulation, moderate output powers, and with output in a variety of wavelength regions. Furthermore, because the mode field diameter (MFD) of a VCSEL can be designed to closely match those of a single-mode fiber, low-loss coupling to the fiber can be achieved. See: T. Wipiejewski et al. (1993) "Efficient alignment tolerant coupling of vertical-cavity lasers to single mode fiber," Technical Digest ECOC '93 session WeP7.3 p.33.

In direct mirror devices (i.e., those in which there is no fiber intervening between the gain element and the mirror, the total minimum cavity length of the hybrid lasers of this invention will only be slightly larger than the VCSEL structure to allow for air-gap tuning. Such a cavity length corresponds to a FSR~21429 GHz assuming a laser index of 3.5, which translates to a wavelength tuning range of 171 nm at 1550 nm.

Figure 3:
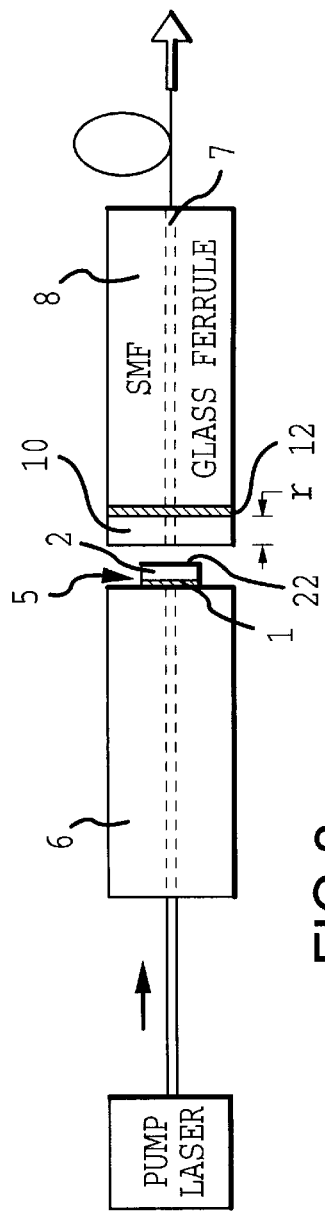
FIG. 3 is a schematic illustration of an optically pumped FFP-SEL.
Figure 4:
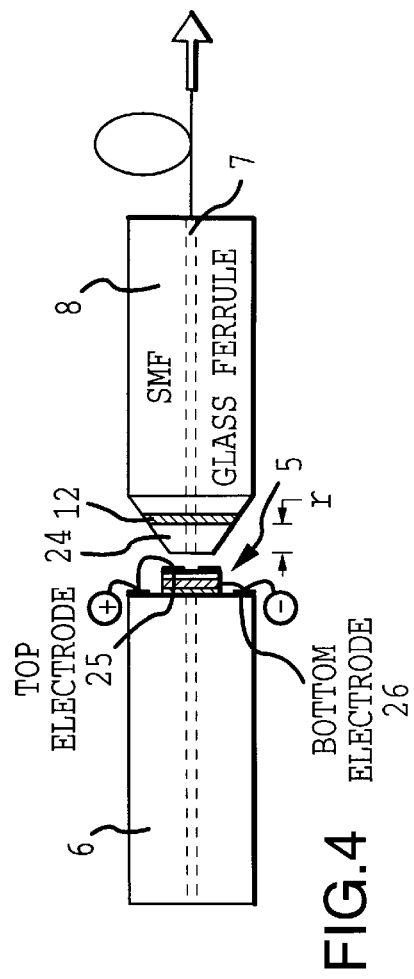
FIG. 4 us a schematic of an electrically pumped FFP-SEL.

Ferrule configurations for integrating optically-pumped or electrically-pumped SEL into a FFP cavity are schematically illustrated in FIGS. 3 and 4, respectively. The VCSEL structures have been discussed earlier. After dicing the laser wafer into, for example, ~1 mm² chips, each VCSEL's bottom reflector surface is bonded onto the end face (i.e., facet) of a ferrule (6). The VCSEL substrate is then selectively etched away to expose the gain region. In FIG. 3 the bottom mirror 1 is preferably a hybrid, a wafer-fused, or a monolithic mirror, the semiconductor (2) interface (22) is optionally AR-coated for both pump and lasing wavelengths, and the top mirror (12) has a reflectivity determined by output power optimization. Ferrule (6) can be provided with an axial optical fiber for introducing pump light into the half-cavity. A fiber waveguide (10) (a portion of a glass ferrule) is bonded to a glass ferrule (8). The waveguide-bonded ferrule carries a single mode fiber (7) with the embedded mirror surface (12) aimed for <0.02° perpendicularity. In the optical pumping mode of the device of FIG. 3, the pump laser light can be introduced through an axial fiber in ferrule (6). In this case, pump light and generated laser light will exit the cavity through fiber (7) and a WDM and/or an optical isolator can be used to separate pump light from generated laser light. This pumping configuration with pump light entering through ferrule (6) is particularly useful when organic polymer materials are used as the gain material.

In the optical-pumping geometry, the VCSEL surface area can be much larger than the MFD of the single mode fiber, and the specific lasing channel is defined by a combination of gain guiding and thermal lensing in the VCSEL, and wave shaping by the SMF waveguide (10) segment of μm-length (r), if it is present, inside the FFP cavity as shown in FIG. 3. The SMF waveguide (10) has proven to be important in achieving high-finesse and low-loss FFP cavities in FFP-TF, and facilitates alignment stability. The internal fiber waveguide's wave shaping ability can be used to define an optimum lasing channel in the VCSEL. Fiber ferrule assembly techniques can be used to fabricate fiber waveguide as short as <5 μm in length, therefore the inclusion of a 5 μm-long fiber in the FFP cavity will reduce the FSR to >84 nm at 1550 nm wavelength (note n~1.465 for SMF). On the other hand, without using the fiber waveguide, the tuning range can be >100 nm.

Figure 5:
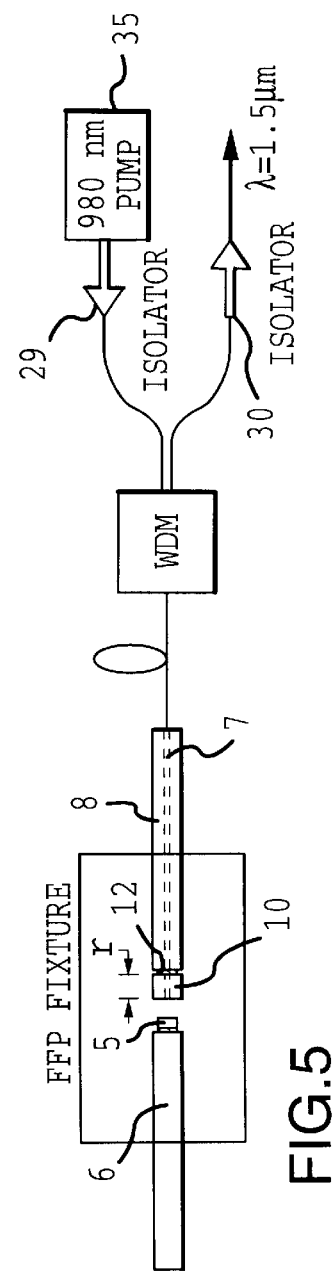
FIG. 5 is a schematic of a reverse optical pumping configuration that can be used to make the lasers of this invention.

A reverse optical pumping setup is shown in FIG. 5 where the pump beam passing through isolator (29) from pump laser (35) and the output lasing beam passing through isolator (30) are always collinear, therefore as the output fiber coupling position changes, a new lasing region can be activated. This alignment flexibility allows the lasing region to be slightly altered to avoid any defect sites. From the above, it is clear that alignment criterion for SEL positioning on the metal ferrule end face is not critical in an optically pumped configuration. In contrast, the overall cavity alignment is important for achieving maximum single mode lasing. Cavity alignment can be carried out actively (with pump (laser on) inside a FFP alignment fixture. The perpendicularity of the VSCEL half cavity on the metal ferrule is also important for overall cavity alignment. The half-cavity preferably has 0.02° perpendicularity to facilitate alignment in the fixture. In this optical pumping configuration a wavelength division multiplexor coupler is used to separate pump light and generated laser light.

For electrical pumping, electrical connections are needed and more stringent heat dissipation is preferred. One possible design for providing current to the VCSEL is illustrated in FIG. 4 where a top (+) electrode (25) is in contact with the gain material (2) a bottom (–) electrode is in contact with the bottom mirror of the half-cavity VSCEL. In FIG. 4, the fiber waveguide and ferule are illustrated as beveled (e.g., typically to ~1 mm in diameter), an optional feature which can be used to avoid the solder bumps associated with the electrical connections.

Long-wavelength VCSELs have been more easily fabricated using optical pumping than using electrical pumping. The advantages of optically-pumped VCSELs include available higher optical gain due to longer active region, lower optical loss and no doping of the semiconductor, less heat dissipation as electrical resistance does not exist, lateral alignment is less critical, and easier packaging because there are no electrical connections. Optical pumping by 980 nm laser diodes is a mature technology at relatively low cost as a result of the wide-spread use of these pump diodes in optical fiber amplifier applications. Both the optical pumping and electrical pumping approaches are viable methods for obtaining long wavelength lasers. For the 800 nm to 1000 nm wavelength region, since electrically-pumped VCSELs can be easily fabricated, FFP-SEL devices will preferably be electrically driven.

A variety of alignment fixtures have been used for the construction of FFP fixed and tunable interferometers. Alignment fixtures used in tunable filters typically provide for tuning of the filter air-gap using piezoelectric transducers (PZTs). All of these alignment and tuning fixtures used for FFP interferometers can be used to construct the hybrid lasers of this invention. FIG. 6 illustrates an exemplary PZT-tunable fixture with the hybrid laser of FIG. 1B in place. The fixture of FIG. 6 (shown in cross-sectional view) has two mounting rings (40) preferably made of lightweight materials. A cylindrical PZT (41) is bonded between the two mounting rings to form the fixture. The mounting rings and bonded PZT provide a cylindrical cavity for receiving the ferrules. The cavity in the mounting rings is sized to closely receive the ferrules. The PZT itself preferably does not contact the ferrules once introduced into the fixture. The ferrules are positioned in the fixture, aligned and each ferrule is bonded to one mounting ring. An epoxy layer (43) is preferably used to bond a ferrule to a mounting ring. Room-temperature-cured, heat-cured as well as UV-cured epoxy can be used. A preferred method of constructing aligned ferrule assemblies, including those of FIGS. 1A–1E, in the fixture of FIG. 6 includes the steps: alignment and bonding of the two mounting rings and the PZT, alignment of the FP cavity without the fixture in place and marking the relative ferrule positions, insertion of the fixture and realignment of the cavity, and then bond the ferrules to the fixture. Fixtures may also be prepared using similar methods to bond a cylindrical PZT at either of its ends directly to a ferrule. Ferrules are aligned in these fixtures preferably by use of a commercial v-groove x-y-z alignment stage.

Preferred alignment stages have v-grooves for holding a ferrule and which can be adjusted in 6 dimensions (x, y and z (where z is the distance between the ferrules) and by three angles). Commercially available alignment stages can be employed, for example a six axis alignment stage Nano-Block stage from Melles Griot, Boulder Colo. A preferred method for ferrule alignment is to first align the ferrule assembly, insert the ferrules into the passageway of the fixture and returning the fixture with ferrule ends protruding to the alignment stage. The z distance between the ferrule faces is then set and the ferrules are aligned to maximized desired optical signal through the ferrule assembly. The aligned ferrules are bonded into the alignment fixture preferably using a UV cured epoxy, solder or other bonding methods approriate to the ferrule and fixture materials employed. Thus, an external alignment technique (using an alignment stage) in combination with relatively low cost alignment fixtures that can lock and maintain the ferrule alignment obtained using the alignment stage can be employed to manufacture the hybrid fiber lasers of this invention.

In epoxy bonding of ferrules and ferrule alignment fixtures it is preferred that the thickness of the bonds are controlled and uniform. Low shrinkage epoxy that does not substantially effect alignment on curing is preferred. To obtain the precise alignment important for laser performance ferrules and fixture components should be precisely machined preferably to 1/10,000 th of an inch.

In alternative embodiments, the gain element can be mounted in other ways for alignment with a fiber (particularly a fiber carried in a fiber ferrule) for creation of an FP cavity. Alignment methods and alignment and tuning fixtures described above can be readily adapted for use with gain elements mounted on other elements, e.g., flat plates or substrates.

Figure 7A:
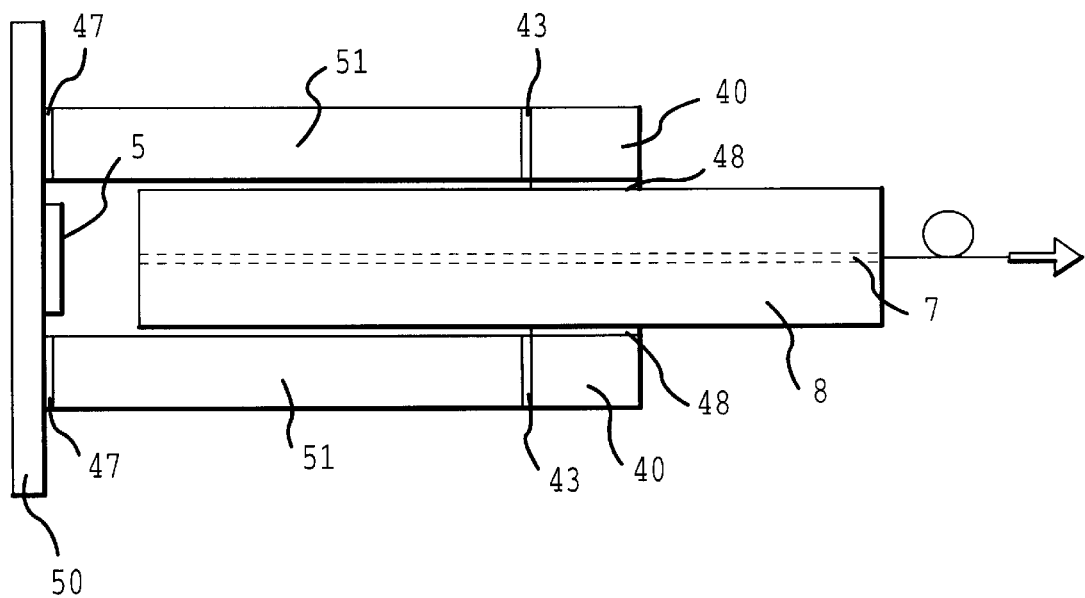
FIGS. 7A–C illustrate an alternative hybrid fiber laser alignment fixture configuration in which the half-cavity VCSEL is within an array on a substrate. The mounted VCSEL is positioned at one end of the PZT and bonded through the mounting element to the PZT. The illustrated device is electrically pumped.

FIGS. 7A and B illustrate an alternative hybrid fiber laser configuration in which the gain element is mounted on a mounting element other than a ferrule, e.g. a flat plate, substrate or other shape that is compatible with alignment and bonding to an alignment/tuning fixture. The mounting element carrying the gain element can be bonded (47) to one end of the alignment fixture. A fiber ferrule (mirror-ended, as illustrated in FIG. 7A, or wafered ferrule) is introduced into the other end of the alignment fixture and an air-gap is selected. The ferrule is then aligned, preferably using an x, y, z alignment stage, to maximize desired optical transmission through the fiber. After alignment the ferrule is bonded (48) into the fixture.

Figure 7B:
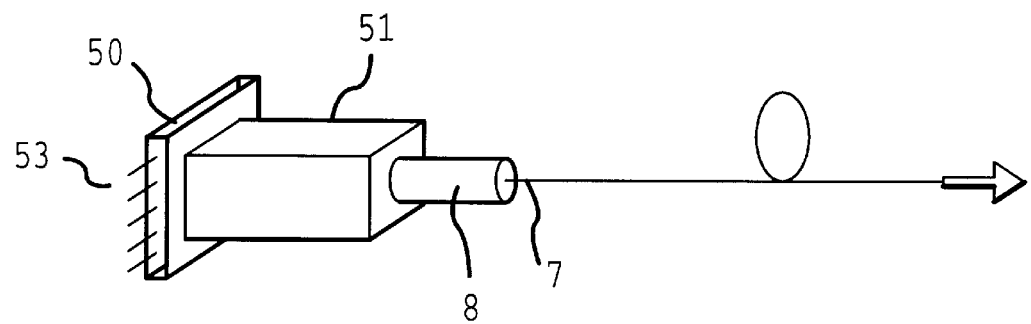
Figure 7C:
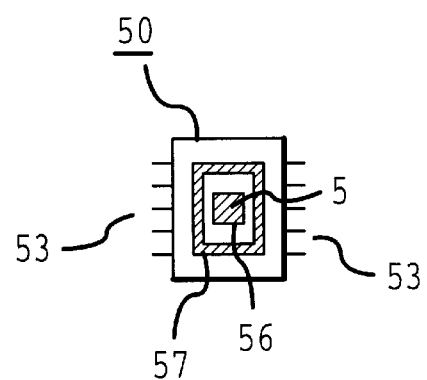

FIG. 7B is a perspective view of the hybrid fiber laser of FIG. 7 which is configured as an electrically pumped system. FIG. 7C is a view of the mounting element with half-cavity VCSEL. The mounting element (50) is a half-cavity VSCEL prepared from a commercially available VCSEL array. Electrodes (53) are provide to supply current to pump the half-cavity VCSEL. The VCSEL array (56) positioned within a Gold-platted frame (57). PZT (5), a rectangular PZT with cylindrical passageway, is bonded to the mounted element onto the gold-plated frame.

Continuous wavelength tuning over about 10.8 nm was obtained in a hybrid fiber laser having the configuration of FIG. 1A employing a half-cavity VCSEL with a semiconductor DBR (of reflectivity $R_1$ equal to ~99.99%) and a multiple quantum well (MQW) gain region. The FP cavity is formed between the DBR (bottom mirror) and a direct single mode fiber-integrated mirror ($R_3$ ~99.6%) with no fiber intervening between the gain element and the fiber-integrated mirror. Wavelength tuning was achieved by changing the air-gap employing a PZT-actuated alignment and tuning fixture as in FIG. 7B.

An oxide-confined, non-lasing 850 nm half-cavity VCSEL with a 5 MQW active region and having a lower reflectivity $R_2$~94% DBR top mirror (i.e., at the top of the gain region) within the FP cavity formed by the higher reflectivity DBR bottom mirror and the fiber-integrated mirror. Half-cavity VCSELs of two different aperture sizes: 3×3 $\mu$m and 8×8 $\mu$m, were examined. Both VCSELs had strong index confinement (which would normally generate multiple transverse modes in a complete (or full) VCSEL, but which provided for single-frequency operation in the half-cavity VCSEL mode in the hybrid laser configuration.

Figure 8:
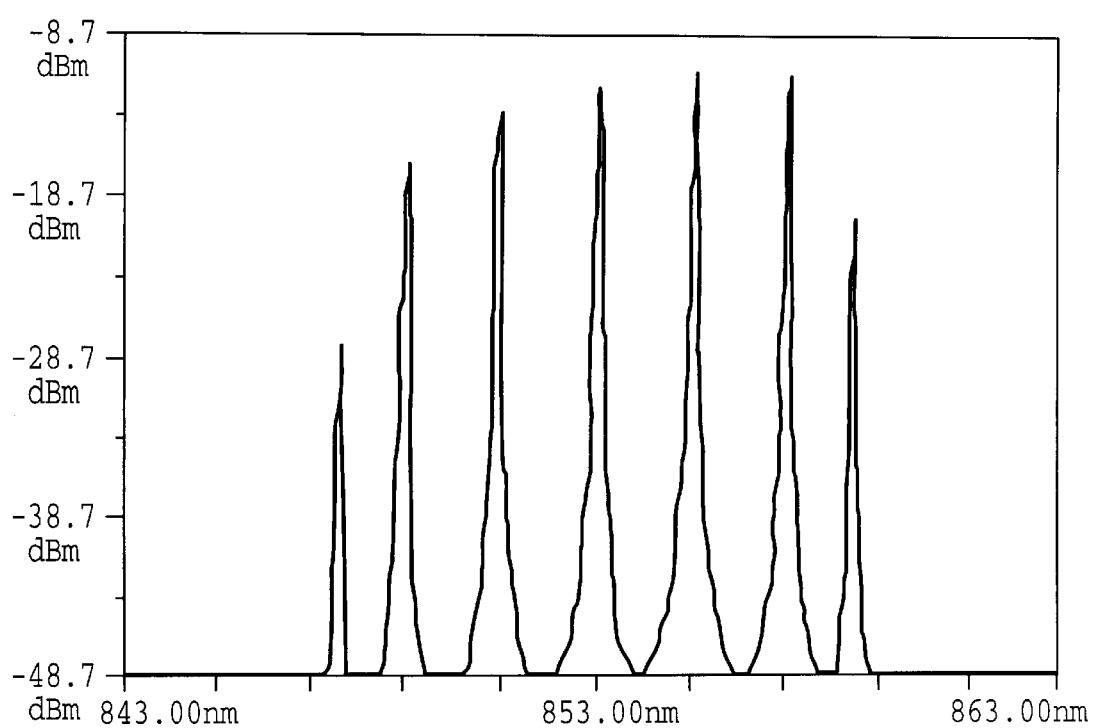
FIG. 8 is a graph illustrating tuning range of an 850 nm direct mirror hybrid fiber laser.

In this hybrid fiber laser configuration lasing was observed with a threshold current Ith~3 mA for both aperture sizes. FIG. 8 shows tuning results for the 8×8 $\mu$m aperture laser obtained by changing the FP cavity air-gap length with the PZT actuator. Continuous wavelength tuning over 10.8 nm was observed by using an optical spectrum analyzer at 0.1 nm resolution. The output power level reached ~100 W at Ip=10 mA. Single-frequency operation was observed for all Ip employed. Similar wavelength tuning can be obtained over an air-gap change of 2–3 $\mu$m because of the low cavity loss in the configuration employed. Continuous tuning over 3.3 nm was obtained at Ip=10 mA with the 3×3 $\mu$m aperture device. Alignment of these devices can affect single-mode operation with 1 or 2 side modes arising with non-optimal alignment.

In these direct mirror devices, transverse optical mode confinement was obtained from the oxide aperture design of the half-cavity VCSEL. The larger mode-field diameter profile of the larger-aperture VCSEL incurs less diffraction loss in the air gap of the cavity, and thus results in a wider tuning range. However, larger aperture sizes also tend to generate multiple transverse modes. The 8×8 aperture device, in particular, appears to have a mode-field diameter relatively compatible to the 5.0 $\mu$m mode-field diameter of the single-mode fiber used which enabled single transverse mode operation after coupling through the fiber. The mode-field diameter of the VCSEL preferably matches that of the output single mode fiber to achieve maximum power coupling. Tuning range appears limited by a compound-cavity effect. This effect can be reduced by eliminating the top DBR or by use of AR coatings.

Figure 9A:
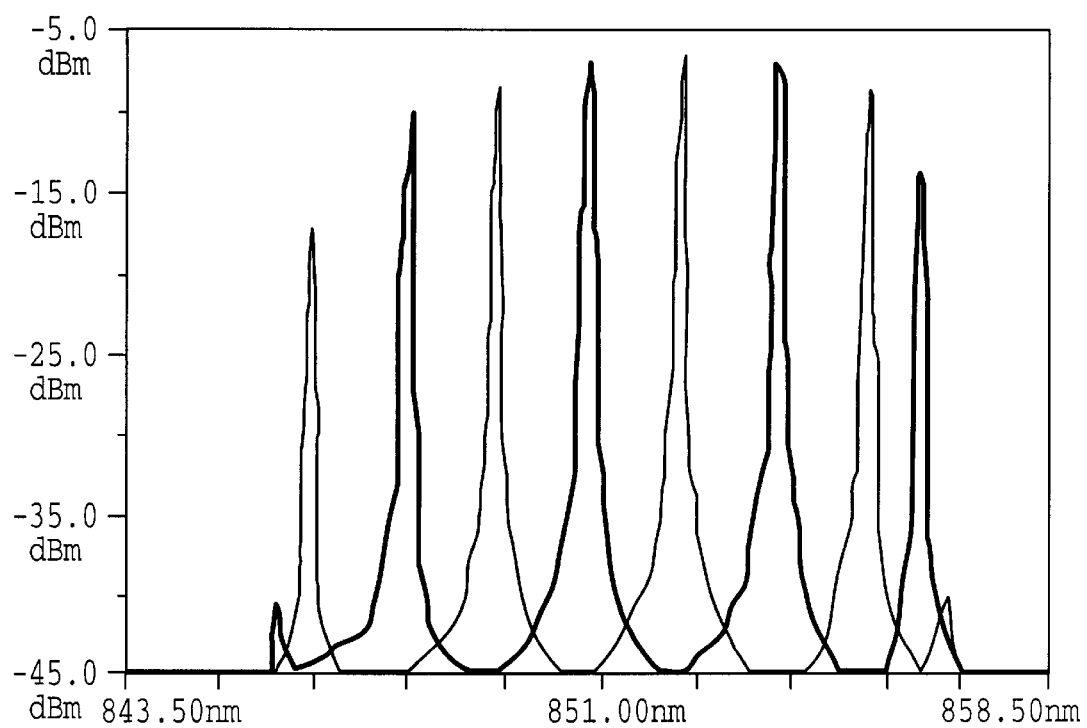
FIGS. 9A and 9B are graphs illustrating tuning range and optical spectrum of a 850 nm waveguide mirror fiber laser.
Figure 9B:
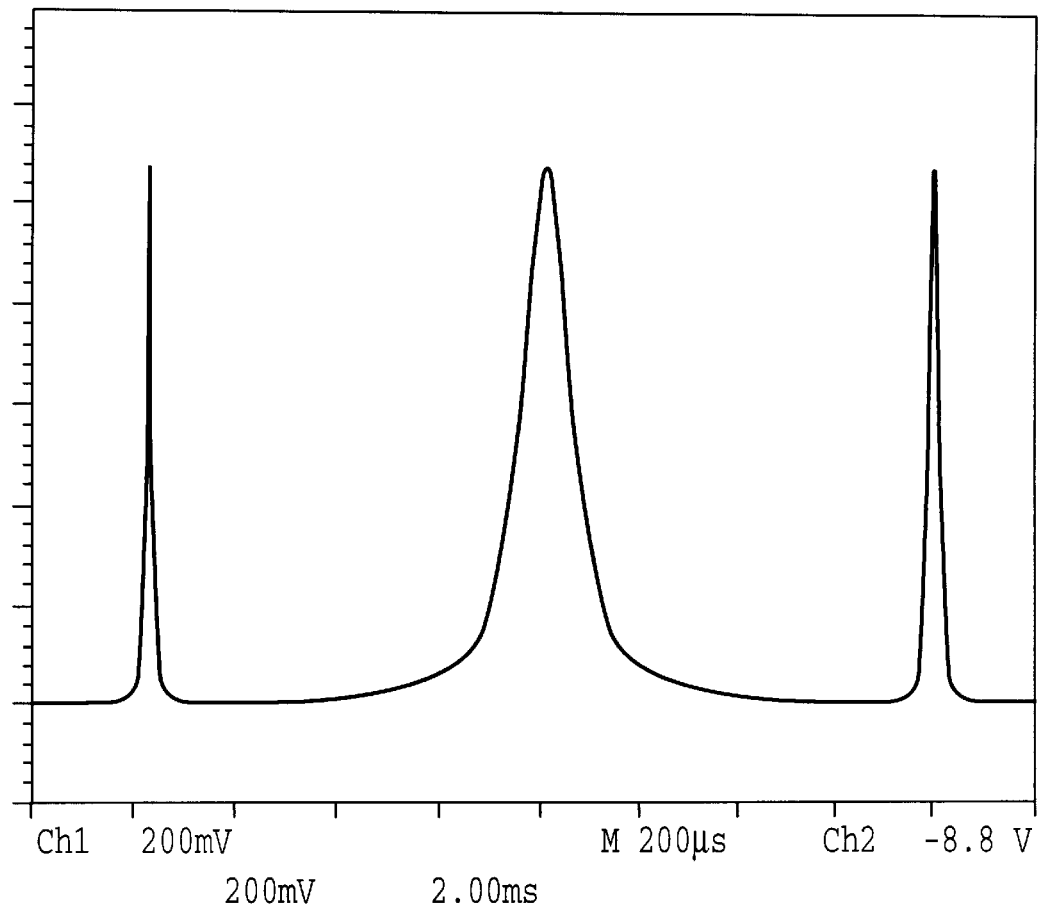
Figure 9C:
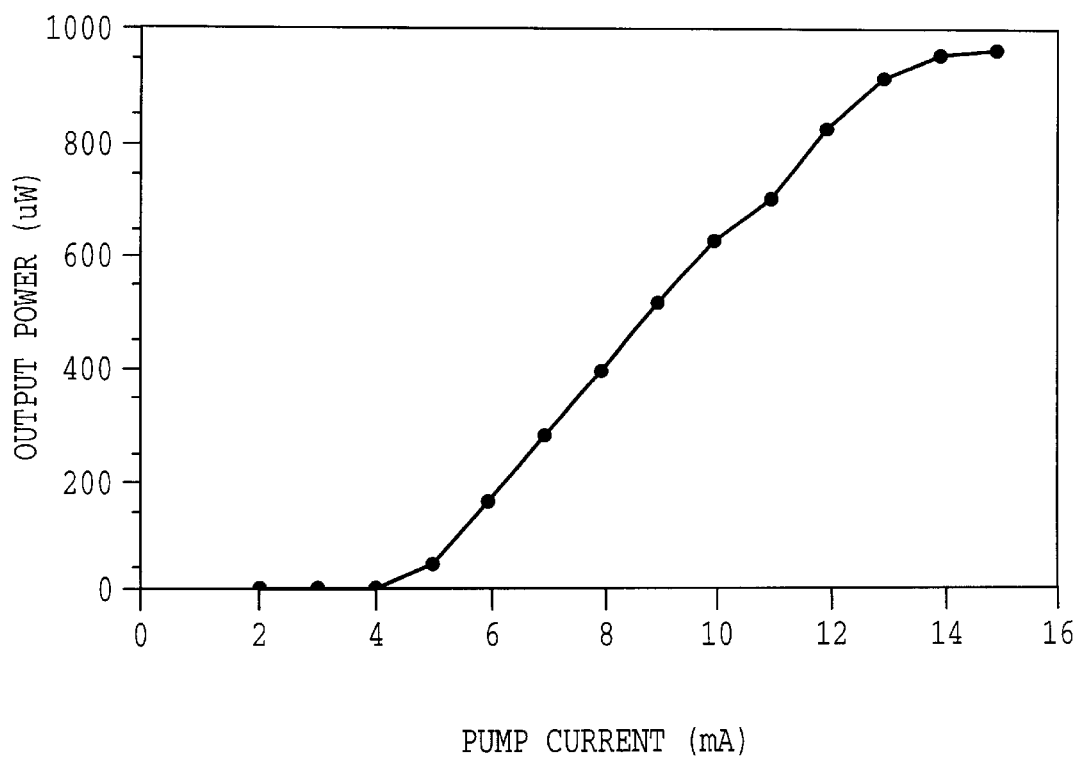
FIG. 9C is a graph of output power vs. pump current for the same hybrid fiber laser.

Continuous wavelength tuning over about 9.84 nm was observed in a hybrid fiber laser having the configuration of FIG. 1B employing the 8×8 μm aperture, half-cavity VCSEL. In this device a single mode fiber waveguide (constructed in a wafered ferrule with an embedded mirror) with mirror $R_3$~98.8% with waveguide length (r) of 10.3 μm replaced the direct fiber-integrated mirror. FIG. 9A illustrates continuous wavelength tuning over about 9.84 nm. Note the emergence of ~30 dB secondary mode at the edge of the tuning range. FIG. 9B illustrates the direct optical spectrum generated by this hybrid fiber laser using an FFP scanning interferometer with resolution of about 11 GHz. Frequency jitter was significantly reduced by using an 850 nm optical isolator in the system. The threshold current was about 4 mA and a maximum fiber-coupled output power reaching about 1 mW at Ip ~15 mA could be obtained, see FIG. 9C. The resultant slope efficiency is about 9.1%. This configuration employing the waveguide integrated-fiber mirror exhibits significant improvement in frequency stability and transverse-mode selection compared to the direct mirror configuration device. The use of an ultra-low noise current source to drive the laser resulted in a significant reduction in frequency jitter, while maintaining lasing linewidth in the range of 10's of MHz.

Lasing was not obtained in attempts to employ the 3×3 aperture half-cavity VCSEL in a waveguide mirror configuration of FIG. 1B. It is believed that the small mode-field diameter of the smaller aperture device resulted in a intracavity coupling loss too high to allow lasing operation.

Continuously tunable 1.3 μm optically-pumped hybrid fiber lasers of configurations of FIGS. 1A and B were also constructed. These devices employed the optically-pumped configuration illustrated in FIG. 5. A combination of a 980 nm pump laser and a 980/1300 wavelength-division-multiplexor (WDM) was used to achieve continuous optical pumping and output coupling. A half-cavity VCSEL with active layers consisting of 7 strained InGaAsP quantum wells fused to a 25-period AlAs/GaAs DBR of expected reflectivity $R_1$ ~99.8% was employed. The half-cavity VCSEL was not patterned for optical pumping, but included a one-dimensional array of 10 μm-wide channels separated by 200 μm which improve fusion uniformity (D. I. Babic Et al. (1996) "Fabrication and Characteristics of double-fused vertical cavity lasers," Opt. Quantum Electron., 28: 475–485). In this case, the VCSEL material employed was in the form of strips of active material and excised pieces having diagonals of approximately 2.5 mm.

Fiber optic components are mounted in cylindrical glass ferrules and the VCSELs were mounted onto cylindrical metal ferrules to facilitate alignment as described above and illustrated in the reversed optically-pumped configuration of FIG. 5. Tuning was achieved by changing the length of the FP cavity air-gap.

In the 1.3 μm-optically pumped hybrid laser configuration of FIG. 1A with a direct fiber-integrated mirror of $R_3$ ~99.8%, single-frequency lasing with a continuous tuning range of about 20.2 nm was observed at a pump power (where Pp is measured through $R_3$) of ~37.6 mW. Lasing is very stable on the short wavelength side where the air-gap is nearly zero. As the air-gap is increased nearly the long wavelength side of the tuning range, a side mode is observed indicating multiple transverse mode lasing. The peak power decreased by about 8 dB from the peak wavelength to the edge of the tuning range. A threshold pump power (Pth) of about 7 mW and a maximum Po reaching about 25 μW. A wide variation of about 11 mW in Pth was measured across most of the tuning range.

Figure 10:
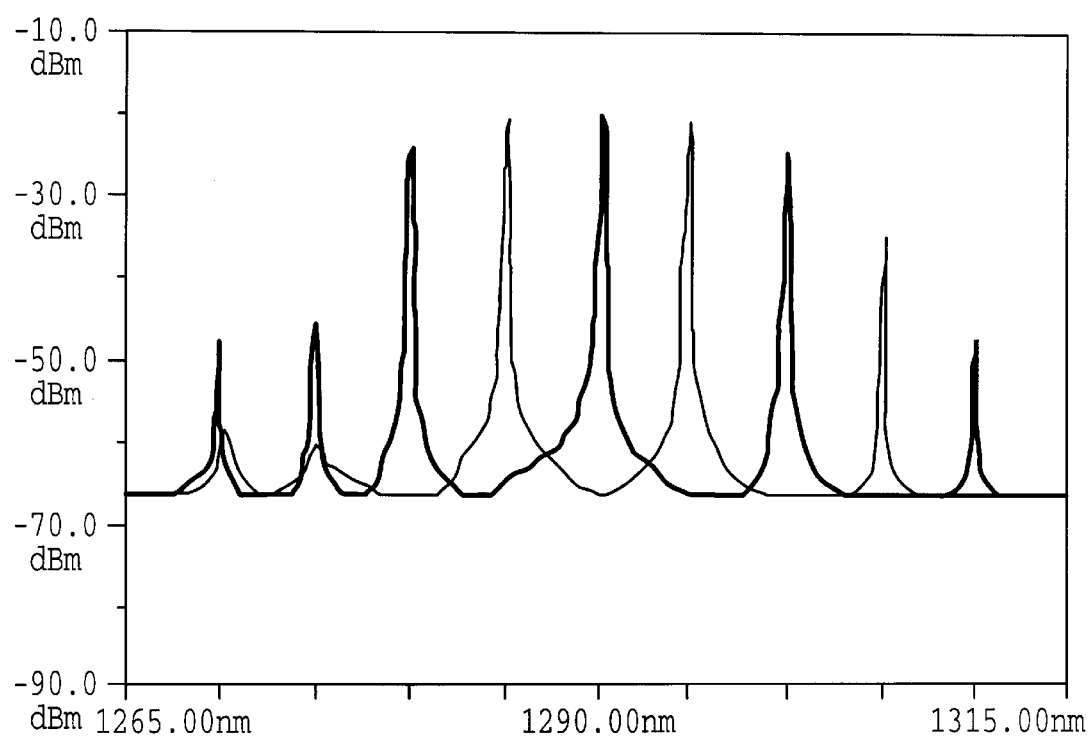
FIG. 10 is a graph illustrating tuning range in a 1.3 μm-optically pumped hybrid laser configuration having $R_3 \sim 99.6\%$ direct fiber-integrated mirror.

When a lower reflectivity fiber-integrated mirror of $R_3$~99.6% was used in place of the higher reflectivity (99.8%) mirror, improvements in both tuning range and power were observed. As illustrated in FIG. 10A a tuning range as wide as 40 nm (from 1269.9 to 1309.9 nm) was obtained at Pp ~21.17 mW. The lower power wavelengths at either side of the tuning range are near threshold. The laser exhibited a threshold pump power (Pth) of about 6 mW and a maximum Po reaching about 36 μW. This Pth translates to a threshold current density of about 7800 A/cm$^2$ assuming a worst case of 100% pump absorption. On optimization of alignment in this device a Po of about 200 μW was obtained. An associated weak amplified spontaneous emission (ASE) bump on the short wavelength side of the tuning range was observed with a resulting Po vs. Pp characteristic at 1289.2 nm (FIG. 10B, closed squares). Rapid wavelength-swept operation (at 18.75 nm/msec) of a hybrid laser device (direct mirror $R_3$~99.6%) aligned in a PZT ferrule alignment fixture (as in FIG. 6) could be achieved. Tuning over about 24 nm was demonstrated over a sweep rate range of 1.68 nm/msec to 18.75 nm/msec.

The better performance of the device having the 99.6% reflectivity fiber-integrated mirror compared to the device having the 99.8% mirror is believed to be due to variations in mirror quality and design.

Figure 11A:
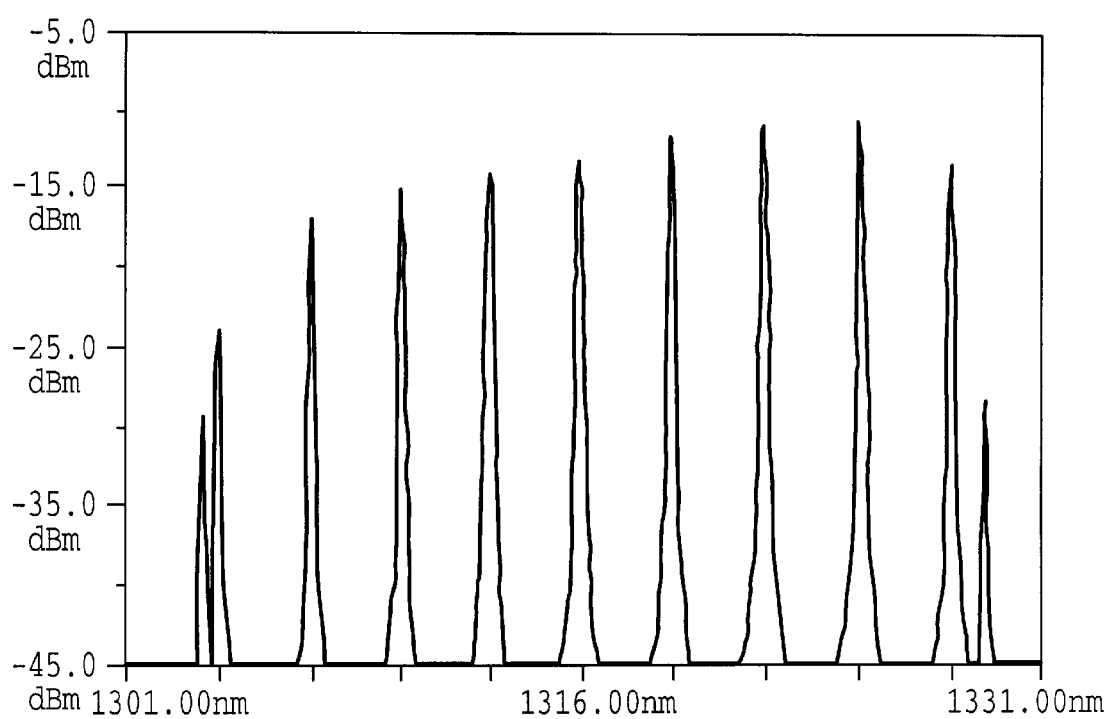
FIG. 11A is a graph illustrating tuning range in 1.3 μm-optically pumped hybrid laser configuration having a waveguide integrated fiber-integrated mirror.
Figure 11B:
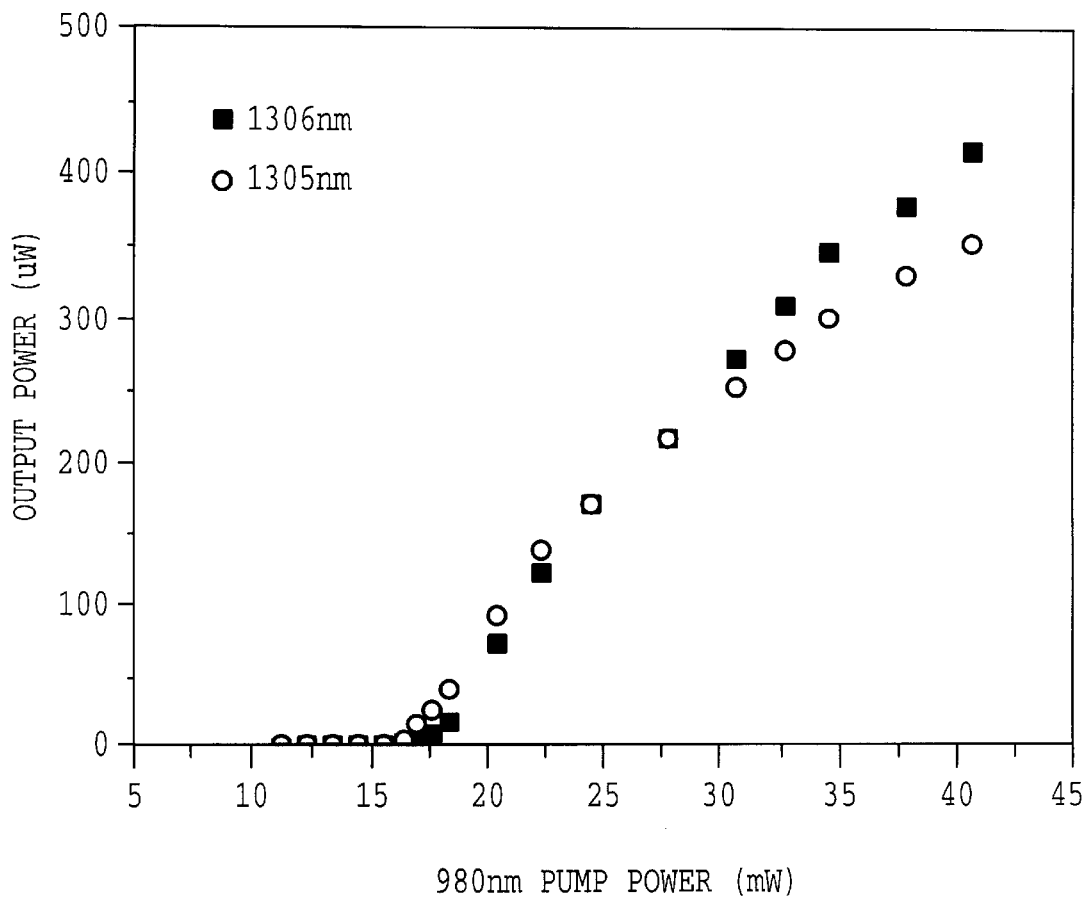
FIG. 11B is a graph of output power vs. pump power for the same hybrid fiber laser.

In the 1.3 μm-optically pumped hybrid laser configuration of FIG. 1B with an embedded fiber-integrated mirror of $R_3$ ~99.6% with a waveguide (i.e., wafer) length of about 13 μm, single-frequency lasing with a continuous tuning range of about 25.74 nm was obtained, see FIG. 11A. Very high CW output power reaching 413 μW was obtained at 1306 nm corresponding to ~1.6% slope efficiency. This hybrid fiber laser employed single mode pump fiber having a cutoff wavelength of about 920 nm. (Note the wafered element still employs fiber with cutoff of 1210 nm.) FIG. 11B is a graph of Po vs. Pp characteristics for 1305 and 1306 nm where Pth is ~16–17 mW. Single-frequency operation is not limited by the FSR (free spectral range) of the cavity (about 30 nm), but appears to be limited by a higher λ-dependent loss likely due to the presence of two internal reflection surfaces in the cavity in the waveguide configuration (FIG. 1B). Such compound-cavity effects can be minimized by use of anti-reflection (AR) coating within the air gap of the FP cavity. Alternatively, an index matching fluid can be introduced in the air gap of the FP cavity.

The choice of cutoff of the single mode fiber employed in the hybrid fiber laser was important to obtaining optimal tuning range. In the hybrid fiber laser whose output is illustrated in FIG. 11A (920 nm cutoff SMF), the earlier use of single mode pump fiber having a cutoff of about 1210 nm resulted in a significantly lower tuning range.

In hybrid fiber lasers of configuration FIG. 1A with a direct integrated-fiber mirror, 1 to 2 finely-spaced transverse modes of about 1 GHz spacing can be observed depending upon the pump power and alignment of the cavity. In contrast, in the hybrid fiber lasers with the waveguide integrated-fiber mirror, single-frequency lasing with linewidth of about 10's of MHz has been observed using an FFP scanning interferometer of about 42 MHz resolution.

The device configuration of FIG. 1B can be employed with waveguides, i.e intracavity fibers, ranging in length from about 0.5 μm to about 10 mm long. Devices with longer length waveguide (i.e., those with lengths ranging from about 1 mm to about 10 mm and specifically those ranging from about 1 mm to about 5 mm) can be employed for multi-wavelength generation and mode-locking operation. Multiple longitudinal mode lasing can be achieved using 1 mm and 5 mm-long waveguide mirrors in the configuration of FIG. 1B.

The integrated-fiber mirror employed in the specifically exemplified devices above are formed from $TiO_2/SiO_2$ deposition on the fiber end at a ferrule end face (either at an exposed endface or embedded between a ferrule and a wafer).

Hybrid fiber laser device of this invention with improved performance can be obtained by use of higher reflectivity bottom mirrors ($R_1$) in the FP cavity, by the use of AR coating in the FP cavity air gap, optimized choice of optical fiber with appropriate cutoff wavelengths for a desired application, optimization and stable maintenance of device alignment, and optimization of the gain region (i.e., the active layers) for a particular application.

Those of ordinary skill in the art will appreciate that configuration, materials and methods other than those specifically described herein can be employed to achieve the goals of this invention.

All references cited herein are incorporated in their entirety by reference herein.

We claim:

1. A laser which comprises a gain element within a Fabry-Perot cavity formed between a first and a second mirror wherein the first mirror is an optical fiber-integrated mirror and wherein the gain element is not confined within an optical fiber.

2. The laser of claim 1 wherein the gain element comprises a gain medium selected from a semiconductor or an organic light-emitting polymer.

3. The laser of claim 1 wherein the gain element comprises a semiconductor multiple quantum well gain region or a semiconductor bulk gain region.

4. The laser of claim 1 wherein the gain element is a thin layer less than about 10 microns thick within the Fabry-Perot cavity.

5. The laser of claim 1 wherein the second mirror is a semiconductor Bragg reflector.

6. The laser of claim 1 wherein the first mirror is a direct fiber dielectric mirror.

7. The laser of claim 1 wherein the first mirror is a fiber waveguide dielectric mirror.

8. The laser of claim 1 wherein the first mirror is an in-fiber Bragg grating.

9. The laser of claim 1 wherein the first mirror is a fiber loop mirror.

10. The laser of claim which is optically pumped.

11. The laser of claim 1 which is electrically pumped.

12. The laser of claim 1 wherein the Fabry-Perot cavity is formed in an optical fiber ferrule assembly.

13. The laser of claim 12 wherein the optical fiber ferrule assembly comprises a mirror-ended fiber ferrule.

14. The laser of claim 13 wherein the optical fiber ferrule assembly comprises a wafered ferrule with embedded mirror.

15. The laser of claim 1 wherein the gain element is attached to the internal end face of a metal ferrule.

16. The laser of claim 14 wherein the gain element comprises a semiconductor multiple quantum well gain region or a semiconductor bulk gain region.

17. The laser of claim 15 wherein the semiconductor multiple quantum well gain region is an InGaAsP or an AlGaAs active region.

18. The laser of claim 1 that is tunable.

19. The laser of claim 1 having an air gap in the Fabry-Perot cavity and that is tuned by changing the length of the air gap within the Fabry-Perot cavity.

20. The laser of claim 1 that is tunable by changing the length of the single mode fiber within the Fabry-Perot cavity by application of a mechanical or electromechanical force or a temperature change to stretch and/or contract the fiber.

21. The laser of claim 1 which comprises a ferrule assembly having a first and a second ferrule at least one of which is a fiber ferrule having an axial fiber path there through and wherein alignment of the first and second ferrules forms the Fabry-Perot cavity, the first fiber-integrated mirror of the Fabry-Perot cavity being contained in that fiber ferrule, the second mirror of the Fabry-Perot cavity being a semiconductor Bragg grating attached to the second ferrule, the gain element within the Fabry-Perot cavity comprising a semiconductor multiple quantum well gain region integral with the second mirror wherein alignment of the first and second ferrules forms the Fabry-Perot cavity.

\* \* \* \* \*

UNITED STATES PATENT AND TRADEMARK OFFICE
CERTIFICATE OF CORRECTION

PATENT NO.   : 6,263,002 B1
DATED        : July 17, 2001
INVENTOR(S)  : Hsu et al.

It is certified that error appears in the above-identified patent and that said Letters Patent is hereby corrected as shown below:

Title page,
Item [57], last line, please replace "21" with -- 2 --.

Column 2,
Line 26, please replace "1(2)" with -- 3(2) --.
Line 33, please replace "2:866-868" with -- 9:866-868 --.

Column 4,
Line 59, please replace "ca" with -- can --.

Column 6,
Line 32, please replace "FFP-SEL" with -- FFP-SELs --.

Column 7,
Line 5, please replace "us" with -- is --.
Line 10, please insert -- a -- between "illustration of" and "hybrid".
Line 67, please replace "typically" with -- typical --.

Column 8,
Line 3, please replace "substantially" with -- substantial --.
Line 6, please insert -- a -- between "FIG. 1B is" and "cross-sectional view".

Column 11,
Line 7, please replace "step" with -- steps --.

Column 12,
Line 9, please replace "waveguide" with -- waveguides --.
Line 27, please delete "(" following "pump".
Line 38, please insert -- (26) -- following "bottom (-) electrode".

Column 13,
Line 18, please replace "bond" with -- bonding --.
Line 32, please replace "returning" with -- return --.
Line 34, please replace "maximized" with -- maximize --.
Line 38, please replace "approriate" with -- appropriate --.
Line 49, please insert -- , -- after "laser performance".

UNITED STATES PATENT AND TRADEMARK OFFICE
CERTIFICATE OF CORRECTION

PATENT NO. : 6,263,002 B1
DATED : July 17, 2001
INVENTOR(S) : Hsu et al.

It is certified that error appears in the above-identified patent and that said Letters Patent is hereby corrected as shown below:

Column 14,
Line 10, please replace "provide" with -- provided --.
Line 11, please replace "Gold-platted" with -- gold-plated --.

Column 16,
Line 4, please replace "10A" with -- 10 --.
Line 16, please delete "(FIG. 10B, closed squares)".
Line 64, please replace "waveguide" with -- waveguides --.

Column 17,
Line 9, please replace "device" with -- devices --.
Line 18, please replace "configuration" with -- configurations --.

Column 18,
Line 5, please insert -- 1 -- between "claim" and "which".

Signed and Sealed this

Second Day of July, 2002

*Attest:*

JAMES E. ROGAN
*Attesting Officer*   *Director of the United States Patent and Trademark Office*